(12) United States Patent
Eldridge et al.

(10) Patent No.: US 7,396,236 B2
(45) Date of Patent: Jul. 8, 2008

(54) WAFER LEVEL INTERPOSER

(75) Inventors: Benjamin N. Eldridge, Danville, CA (US); Carl V. Reynolds, Pleasanton, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 09/810,871

(22) Filed: Mar. 16, 2001

(65) Prior Publication Data

US 2002/0132501 A1 Sep. 19, 2002

(51) Int. Cl.
H01R 12/00 (2006.01)
(52) U.S. Cl. .......................... 439/66; 324/754
(58) Field of Classification Search .............. 439/52, 439/53, 66, 67, 60, 91, 482; 324/754, 761, 324/755, 762, 758; 29/842, 844, 843; 361/774, 361/772
See application file for complete search history.

(56) References Cited

U.S. PATENT DOCUMENTS

| | | | |
|---|---|---|---|
| 3,982,159 A | 9/1976 | Dennis et al. | |
| 4,061,969 A | 12/1977 | Dean | |
| 4,293,175 A | 10/1981 | Cutchaw | |
| 4,523,144 A | 6/1985 | Okubo et al. | |
| 4,567,433 A | 1/1986 | Ohkubo et al. | |
| 4,636,722 A | 1/1987 | Ardezzone | |
| 4,719,417 A | 1/1988 | Evans | |
| 4,780,670 A | 10/1988 | Cherry | |
| 4,820,976 A * | 4/1989 | Brown | 324/158 |
| 4,837,622 A | 6/1989 | Whann et al. | |
| 4,899,099 A | 2/1990 | Mendenhall | |
| 4,906,194 A | 3/1990 | Grabbe | |
| 4,965,865 A | 10/1990 | Trenary | |
| 4,968,931 A | 11/1990 | Littlebury et al. | |
| 4,983,907 A | 1/1991 | Crowley | |
| 4,994,735 A | 2/1991 | Leedy | |
| 5,020,219 A | 6/1991 | Leedy | |
| 5,055,778 A | 10/1991 | Okubo et al. | |
| 5,067,007 A | 11/1991 | Otsuka et al. | |
| 5,088,190 A | 2/1992 | Malhi et al. | |
| 5,090,118 A | 2/1992 | Kwon et al. | |
| 5,102,343 A | 4/1992 | Knight et al. | |
| 5,109,596 A | 5/1992 | Driller et al. | |

(Continued)

FOREIGN PATENT DOCUMENTS

EP 463684 1/1992

(Continued)

OTHER PUBLICATIONS

Best et al., "Flexible Probe," IBM Technical Disclosure Bulletin, vol. 15 No. 11 (Apr. 1973), pp. 3428-3429.

(Continued)

*Primary Examiner*—Alexander Gilman
(74) *Attorney, Agent, or Firm*—N. Kenneth Burraston

(57) ABSTRACT

Double-sided interposer assemblies and methods for forming and using them. In one example of the invention, an interposer comprises a substrate having a first surface and a second surface opposite of said first surface, a first plurality of contact elements disposed on said first side of said substrate, and a second plurality of contact elements disposed on said second surface of said substrate, wherein said interposer connects electronic devices via said first and said second plurality of contact elements.

29 Claims, 14 Drawing Sheets

U.S. PATENT DOCUMENTS

| | | | |
|---|---|---|---|
| 5,124,639 A | 6/1992 | Carlin et al. | |
| 5,172,050 A | 12/1992 | Swapp | |
| 5,173,055 A | 12/1992 | Grabbe | |
| 5,187,020 A | 2/1993 | Kwon et al. | |
| 5,191,708 A | 3/1993 | Kasukabe et al. | |
| 5,225,777 A | 7/1993 | Bross et al. | |
| 5,228,861 A | 7/1993 | Grabbe | |
| 5,323,107 A | 6/1994 | D'Souza | |
| 5,329,226 A | 7/1994 | Monnet et al. | |
| 5,382,898 A | 1/1995 | Subramanian | |
| 5,395,253 A | 3/1995 | Crumly | |
| 5,399,982 A | 3/1995 | Driller et al. | |
| 5,437,556 A | 8/1995 | Bargain et al. | |
| 5,476,211 A | 12/1995 | Khandros | |
| 5,517,126 A | 5/1996 | Yamaguchi | |
| 5,521,518 A | 5/1996 | Higgins | |
| 5,534,784 A | 7/1996 | Lum et al. | |
| 5,546,405 A | 8/1996 | Golla | |
| 5,550,482 A | 8/1996 | Sano | |
| 5,600,257 A | 2/1997 | Leas et al. | |
| 5,629,137 A | 5/1997 | Leedy | |
| 5,629,631 A | 5/1997 | Perry et al. | |
| 5,642,054 A * | 6/1997 | Pasiecznik, Jr. | 324/754 |
| 5,670,889 A | 9/1997 | Okubo et al. | |
| 5,682,064 A | 10/1997 | Atkins et al. | |
| 5,686,842 A | 11/1997 | Lee | |
| 5,701,666 A | 12/1997 | DeHaven et al. | |
| 5,703,494 A * | 12/1997 | Sano | 324/761 |
| 5,729,150 A | 3/1998 | Schwindt | |
| 5,742,170 A | 4/1998 | Isaac et al. | |
| 5,764,072 A | 6/1998 | Kister | |
| 5,773,986 A * | 6/1998 | Thompson et al. | 324/754 |
| 5,786,701 A | 7/1998 | Pedder | |
| 5,791,914 A * | 8/1998 | Loranger et al. | 439/71 |
| 5,806,181 A | 9/1998 | Khandros et al. | |
| 5,821,763 A | 10/1998 | Beaman et al. | |
| 5,828,226 A | 10/1998 | Higgins et al. | |
| 5,852,871 A | 12/1998 | Khandros | |
| 5,917,707 A | 6/1999 | Khandros et al. | |
| 5,998,228 A | 12/1999 | Eldridge et al. | |
| 6,002,266 A | 12/1999 | Briggs et al. | |
| 6,014,032 A | 1/2000 | Maddix et al. | |
| 6,040,700 A | 3/2000 | Berar | |
| 6,046,597 A | 4/2000 | Barabi | |
| 6,050,829 A | 4/2000 | Eldridge et al. | |
| 6,059,982 A | 5/2000 | Palagonia et al. | |
| 6,060,891 A | 5/2000 | Hembree et al. | |
| 6,087,840 A | 7/2000 | Mizuta | |
| 6,133,744 A | 10/2000 | Yojima et al. | |
| 6,137,296 A | 10/2000 | Yoon et al. | |
| 6,142,789 A | 11/2000 | Nolan | |
| 6,150,830 A | 11/2000 | Schmid et al. | |
| 6,160,412 A | 12/2000 | Martel et al. | |
| 6,169,409 B1 | 1/2001 | Amemiya | |
| 6,174,744 B1 | 1/2001 | Watanabe et al. | |
| 6,181,567 B1 | 1/2001 | Roemer et al. | |
| 6,204,455 B1 | 3/2001 | Gilleo et al. | |
| 6,215,320 B1 * | 4/2001 | Parrish | 324/754 |
| 6,215,321 B1 | 4/2001 | Nakata | |
| 6,246,250 B1 | 6/2001 | Doherty et al. | |
| 6,275,052 B1 | 8/2001 | Hembree et al. | |
| 6,289,583 B1 | 9/2001 | Belmont et al. | |
| 6,307,392 B1 | 10/2001 | Soejima et al. | |
| 6,344,752 B1 | 2/2002 | Hagihara et al. | |
| 6,351,134 B2 | 2/2002 | Leas et al. | |
| 6,354,844 B1 * | 3/2002 | Coico et al. | 439/66 |
| 6,359,455 B1 | 3/2002 | Takekoshi | |
| 6,429,029 B1 | 8/2002 | Eldridge et al. | |
| 6,452,407 B2 | 9/2002 | Khoury et al. | |
| 6,468,098 B1 | 10/2002 | Eldridge | |
| 6,483,328 B1 | 11/2002 | Eldridge | |
| 6,991,969 B2 | 1/2006 | Johnson | |
| 2001/0012704 A1 | 8/2001 | Eldridge | |
| 2001/0020747 A1 | 9/2001 | Eldridge et al. | |
| 2001/0054905 A1 | 12/2001 | Khandros et al. | |
| 2002/0004320 A1 | 1/2002 | Pedersen | |
| 2002/0197895 A1 | 12/2002 | Eldridge | |
| 2003/0057975 A1 | 3/2003 | Eslamy et al. | |

FOREIGN PATENT DOCUMENTS

| | | |
|---|---|---|
| GB | 1349786 | 4/1974 |
| JP | 58178293 | 11/1983 |
| JP | 6244285 | 3/1987 |
| JP | 62-142279 | 6/1987 |
| JP | 6363777 | 4/1988 |
| JP | 63243768 | 10/1988 |
| JP | 3-065659 | 3/1991 |
| JP | 365659 | 3/1991 |
| JP | 4-207047 | 7/1992 |
| JP | 5-029406 | 2/1993 |
| JP | 529406 | 2/1993 |
| JP | 650990 | 2/1994 |
| JP | 6273445 | 9/1994 |
| JP | 6313775 | 11/1994 |
| JP | 8-015318 | 1/1996 |
| TW | 334607 | 6/1998 |
| WO | WO 00/01208 | 1/2000 |
| WO | WO 00/33096 | 6/2000 |
| WO | WO 00/75677 | 12/2000 |
| WO | WO 01/13130 A1 | 2/2001 |

OTHER PUBLICATIONS

Leung et al., "Active Substrate Membrane Probe Card," Technical Digest of the International Electron Devices Meeting (IEDM) (Oct. 12, 1995), pp. 709-712.

Emsworth, "High Density Probe Assembly," Research Disclosure 2244, No. 333, p. 33391 (Jan. 1992).

"Portable, Small Contact Area Surface Resistance Probe Assembly," IBM Technical Disclosure Bulletin, vol. 37, No. 2B (Feb. 1994).

* cited by examiner

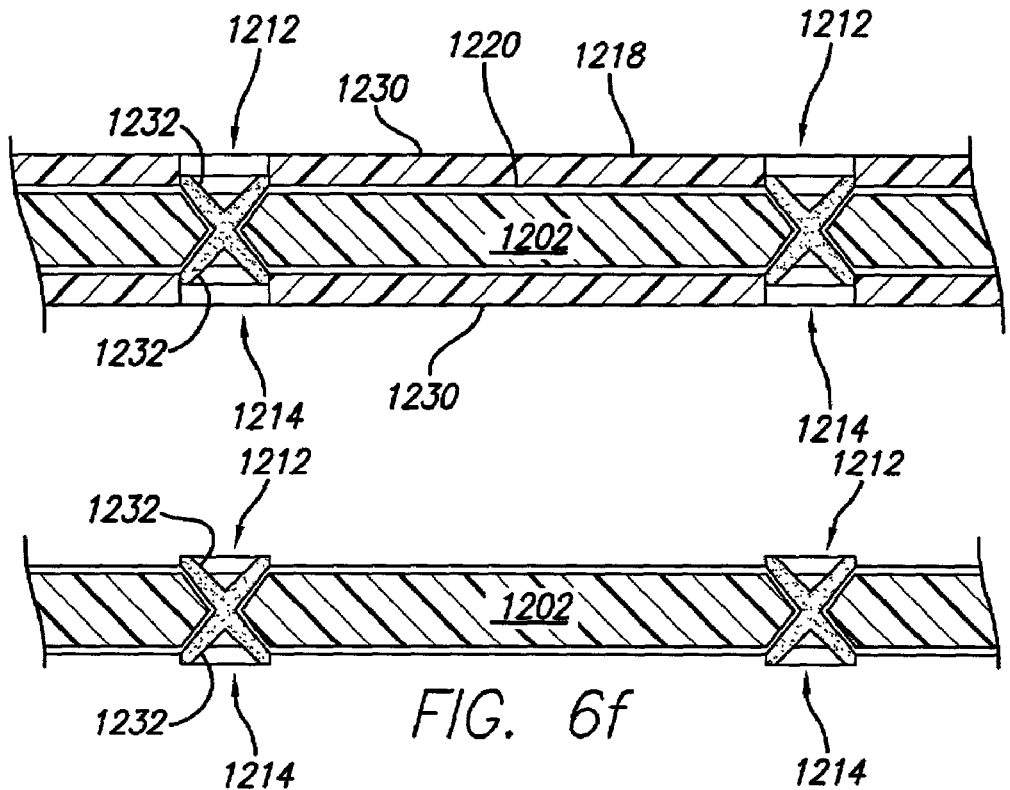
FIG. 6e
FIG. 6f
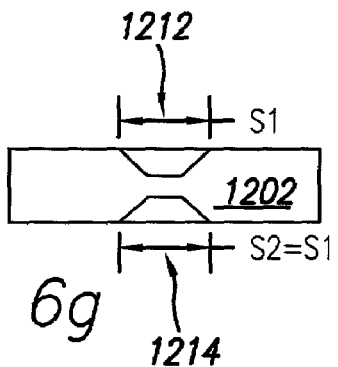
FIG. 6g
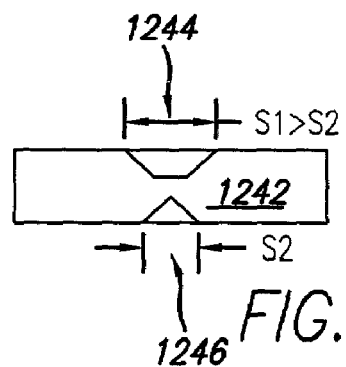
FIG. 6h
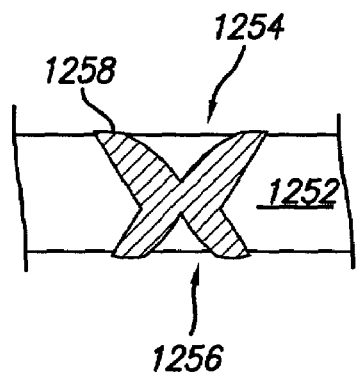
FIG. 6i

WAFER LEVEL INTERPOSER

FIELD OF THE INVENTION

The present invention generally relates to wafer level interposers, and more particularly to interposers having double-sided contact elements for interfacing two electrical devices, and to methods for making such interposers.

BACKGROUND OF THE INVENTION

There are numerous interposers and methods for making and using these interposers in the prior art. Interposers are used for different purposes. Generally, interposers provide an interface between two electrical components, such as one or more semiconductor devices and a printed circuit board, or two printed circuit boards. For example, an interposer can be used to interface a semiconductor wafer to a probe card for testing of the dies on the wafer to determine which dies are good. A wafer tester or prober may be advantageously employed to make a plurality of discrete pressure connections to a like plurality of discrete contact elements (e.g. bonding pads) on the dies. In this manner, the semiconductor dies can be tested, for example, to determine whether the dies are non-functional or partially functional (each, "bad" die), prior to singulating the dies from the wafer.

Testing of semiconductor devices is performed on various levels. For example, in very advanced systems, semiconductor devices may be tested for performance operations, while still in wafer form, under various temperature and environmental conditions. This type of testing is commonly referred to as "wafer level test." Referring to FIG. 1, a test assembly 100 is shown to illustrate a technique for performing wafer-level test and/or wafer level burn-in of semiconductor devices included in a test substrate (application specific integrated circuits (ASIC) 106 and base plate 108, collectively) having active electronic components such as ASICs 106a-106d, mounted to an interconnection substrate or incorporated therein. See commonly assigned U.S. Pat. No. 6,064,213 entitled "Wafer-Level Burn-In and Test", which is herein incorporated by reference as though set forth in full. Spring contact elements 110 effect interconnections between the ASICs 106a-106d (ASICs 106a-106d generally comprise the ASICs 106) and a plurality of devices-under-test (DUTs), 102a-102d, on a wafer-under-test (WUT) 102. In one embodiment, the assembly is disposed in a vacuum vessel with independent temperature regulation so that the ASICs can be operated at temperatures independent from and in many instances significantly lower than the burn-in temperature of the DUTs. The spring contact elements 110 may be mounted to either the DUTs 102a-102d or the ASICs 106a-106d, and may fan out to relax tolerance constraints on aligning and interconnecting the ASICs 106 and the DUTs 102. For the connection 120 to the host controller, a significant reduction in interconnect count and consequent simplification of the interconnection substrate is realized because the ASICs are capable of receiving a plurality of signals for testing the DUTs over relatively few signal lines from a host controller 116 and promulgating these signals over the relatively many interconnections 110 between the ASICs 106 and the DUTs 102. The ASICs 106 can also generate at least a portion of these signals in response to control signals from the host controller 116. Physical alignment techniques are also described in the reference.

During testing, a power supply 118 provides power signals to the ASICs through a base plate 108 connected to an upper portion of a chuck 104a used for holding the test assembly in place with the assistance of guide pins 112. While operational, i.e. under test, force is applied in the z-direction bringing the ASICs 106 in contact with the spring contact element 610 and compressing the latter to a position determined by compression stops 114, which are positioned at either end of the wafer 102. The compression stops function to stop the base plate 108 from moving down in the z-direction thereby determining the extent to which the spring contact elements 110 are compressed and thus avoiding over-compression of the latter.

FIG. 2 illustrates an alternative test assembly 200 including a wafer 202, an interposer 204 and a tester contactor 206. On both surfaces of the interposer, solder balls 210 are formed in order to interconnect wafer 202 to tester contactor 206. The contact pads 208 on wafer 202 come in contact with solder balls 210 on the top surface of interposer 204 when wafer 202 is lowered toward tester contactor 206. Upon further lowering of wafer 202, solder balls 212 on the bottom surface of interposer 204 come in contact with the contact pads 214 of the tester contactor 206, thereby establishing electrical connection between wafer 202 and the tester through tester contactor 206. Typically, a wafer can have in excess of 10,000 contact pads. For instance, a 200 mm wafer may have 20-50 thousand contact pads. To establish reliable connections between such a large number of contact pads between the wafer and the tester is a significant challenge.

In prior art wafer-level testing techniques, the interconnection elements reside on the wafer or the contactor (wiring layer). While this prior art approach provides certain advantages, it also has certain limitations. For example, when the interconnection elements or springs reside on the wafer or contactor, a modular construction approach cannot be implemented for a burn-in system. Similarly, the use of solder balls on the interposer does not permit a modular construction.

It is noted that there are certain existing double-sided interconnection substrates, such as shown in commonly assigned U.S. Pat. No. 5,917,707, entitled "Flexible Contact Structure With An Electrically Conductive Shell" (for example, FIG. 36), and commonly assigned U.S. patent application Ser. No. 08/452,255, entitled Electrical Contact Structures Formed By Configuring A Flexible Wire To Have A Springable Shape And Covercoating The Wire With At Least One Layer Of A Resilient Conductive Material, Methods Of Mounting The Contact Structures To Electronic Components, And Applications For Employing The Contact Structures" (for example, FIG. 39). These prior art substrates, however, do not address completely certain wafer-level testing needs.

A need therefore exists for an improved interposer and a method for making and using the same without the need to connect resilient interconnect elements or other types of interconnect elements onto the DUT and/or the device being packaged.

SUMMARY OF THE INVENTION

The present invention provides a method for testing a semiconductor device wafer comprising connecting a first side of an interposer having a first plurality of resilient contact elements disposed thereon to the wafer, connecting a second side of an interposer having a second plurality of resilient contact elements disposed thereon to a wiring layer and providing a pathway for signals from the wafer going to and from the wiring layer thereby permitting exercising of devices on the wafer.

A method of the present invention also enables performing wafer-level burn-in and test of a plurality of semiconductor devices (DUTs) resident on a semiconductor wafer. This includes providing a plurality of active electronic components having terminals on a surface thereof and providing an interposer for effecting direct electrical connections between terminals of the plurality of DUTs and the terminals of the active electronic components.

In another embodiment of the present invention, a method is provided for forming an interposer by providing a substrate having a first surface and a second surface, the second surface being opposite of the first surface, forming a first plurality of contact elements on the first surface of the substrate and forming a second plurality of contact elements on the second surface of the substrate.

A test assembly in accordance with the present invention comprises a wiring substrate having a first surface, a second surface and a plurality of contact terminals on the first surface thereof, an interposer having a first surface, a second surface, a plurality of contact pads disposed on the first and the second surface thereof, and a first plurality of resilient contact structures mounted adjacent to and extending from the first surface thereof and a second plurality of resilient contact structures mounted adjacent to and extending from the second surface thereof. The interposer provides electrical connection between the wiring surface and the wafer by engaging the contact pads of the wiring surface with the first plurality of resilient contact structures and the contact pads of the wafer with the second plurality of resilient contact structures.

Various other assemblies and methods are described below in conjunction with the following figures.

BRIEF DESCRIPTION OF THE DRAWINGS

The present invention is illustrated by way of example and not limitation in the figures of the accompanying drawings in which like references indicate similar elements.

FIGS. 6a-6f are side cross-sectional views illustrating fabricating capture pads that are hourglass-like through-holes in a substrate in accordance with an embodiment of the present invention.

FIG. 6g is a schematic illustration of a step in the process described with respect to FIGS. 6a-6f in accordance with an embodiment of the present invention.

FIG. 6h is a schematic illustration of an alternate step in the process described with respect to FIGS. 6a-6f in accordance with an embodiment of the present invention.

FIG. 6i is a side cross-sectional view of a socket substrate that has been made using the procedure set forth in FIG. 6h in accordance with an embodiment of the present invention.

DETAILED DESCRIPTION

The present invention relates to an interposer having resilient interconnect elements disposed upon two surfaces of a substrate for contacting a wafer having a plurality of dies disposed thereupon, and to techniques for fabricating such an interposer. As will be evident from the description that follows, techniques of fabricating an interposer involve fabricating interconnect elements directly upon the interposer substrate, or transferring elements of them to the interposer substrate, making connections with sets of interconnect elements for contacting the semiconductor devices while they are a part of the wafer. The interposer is useful for connecting two electronic components generally, and for performing testing, exercising and burn-in in particular. The following description and drawings are illustrative of the invention and are not to be construed as limiting the invention. Numerous specific details are described to provide a thorough understanding of the present invention. However, in certain instances, well-known or conventional details are not described in order to not unnecessarily obscure the present invention in detail.

Certain terms are utilized throughout this document and as such are intended to have the meanings provided below:

The terms "cantilever" and "cantilever beam" are used to indicate that an elongate structure is mounted (fixed) in one region, with another region free to move, typically in response to a force acting with a component transverse to the longitudinal axis of the elongate structure.

The term "resilient", as applied to contact structures or interconnection elements, indicates structures that exhibit primarily elastic behavior in response to an applied load. The free-standing, resilient interconnection elements of the present invention are a special case of either compliant or resilient contact structures.

The term "electronic component" includes, but is not limited to: interconnect and interposer substrates; semiconductor wafers and dies made for example of any suitable semiconducting material such as silicon (Si) or gallium-arsenide (GaAs); interconnect sockets; test sockets; sacrificial members, elements and substrates, semiconductor packages, including ceramic and plastic packages, chip carriers; passive components such as resistors or capacitors, and connectors.

Figure 3A:
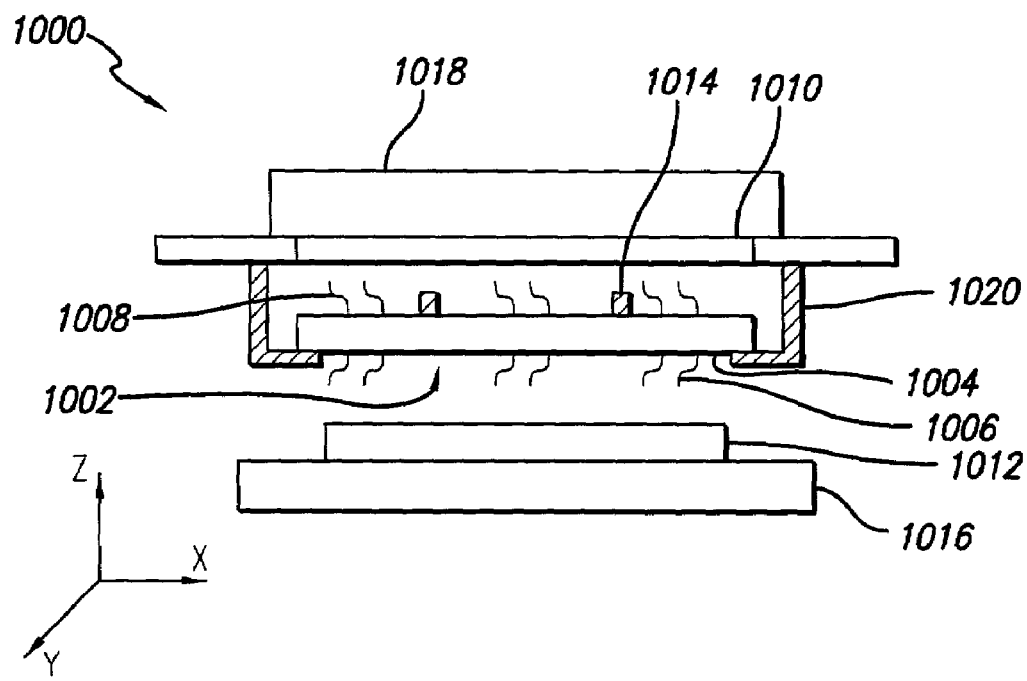
FIG. 3a shows an interconnect assembly including an interposer with compression stops in accordance with an embodiment of the present invention.
Figure 3B:
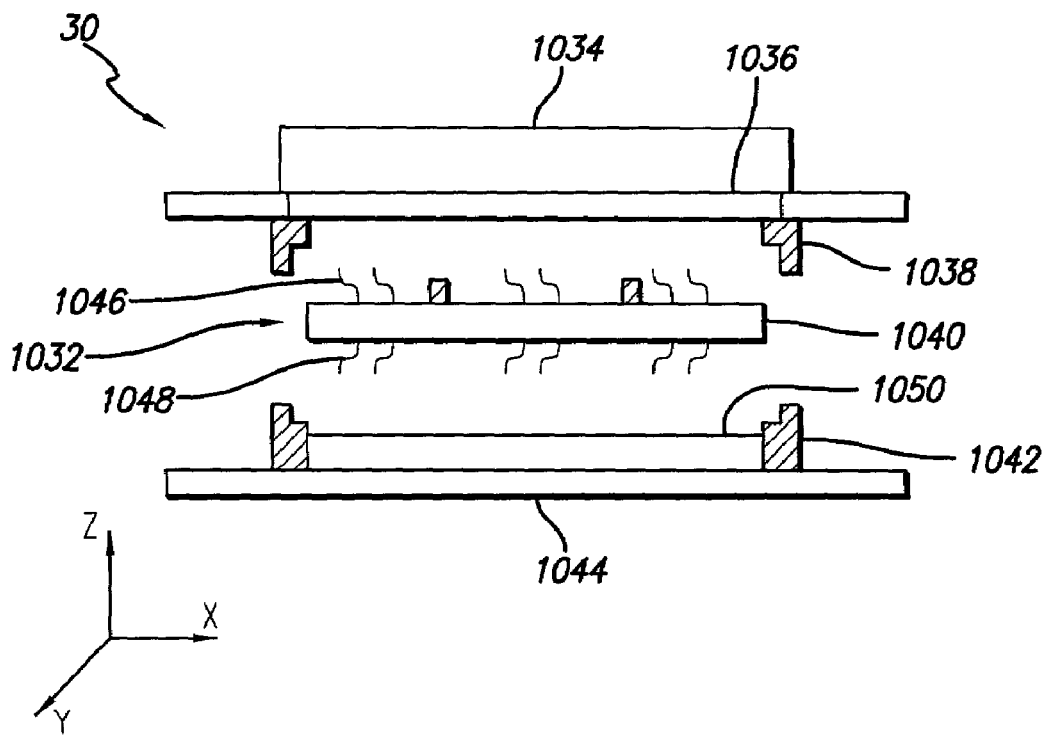
FIG. 3b shows an interconnect assembly including a freely floating interposer without any compression stops in accordance with an embodiment of the present invention.

Turning to address the present invention in detail, FIGS. 3a and 3b illustrate exemplary interconnect assemblies. The interconnect assembly 1000 is shown to include an interposer 1002. Interposer 1002 includes a substrate 1004 with a first surface and a second surface upon each of which surfaces are disposed a plurality of resilient contact elements, 1006 and 1008. In FIG. 3a, an interposer 1002 establishes contact between a wafer 1012 and a wafer contactor 1010 through pressure contacts applied to the contact elements 1006 and 1008. Wafer 1012 is secured to a base support 1016 and the housing assembly 1018 supports contactor 1010. As shown in FIG. 3a, substrate 1004 has disposed thereupon one or more compression stops 1014 for preventing over-compression of the resilient contact elements 1006 and 1008, as will be explained more fully in the discussion herein below.

While a single compression stop 1014 will function to prevent over-compression, it is preferred to have a plurality of compression stops disposed on substrate 1004. The height of the compression stops is predetermined in order to define a first position when the resilient contact elements are in mechanical and electrical contact with another contact elements. In one embodiment of the present invention, there is no need for compression stops on the bottom surface of substrate 1004 since the rigid supports 1020 limit excessive movement of wafer 1012. It should be understood that compression stops similar to 1014 can be provided on the bottom of interposer 1002 to protect the resilient contact elements 1006.

In operation, pressure contact is applied to wafer 1012 moving the latter in the z-direction toward wafer contactor 1010, thereby meeting and then compressing resilient contact elements 1008. When contact elements 1008 are compressed, resilient contact elements 1006 are also compressed thereby establishing mechanical contact between the terminals of wafer 1012 and the terminals of the wafer contactor 1010. It should be noted that the terminals of wafer 1012 and wafer contactor 1010 are not shown in FIG. 3a. Compression stops 1014 prevent over-compression and thereby prevent damage of resilient contact elements 1008.

In general, a conformal or flexible substrate may be used as substrate 1004 for performing wafer-level contacting or other types of application discussed herein or known to those skilled in the art. The use of a conformal substrate permits for compensation of non-flatness in an over all assembly of the type shown in FIG. 3a.

FIG. 3b shows an alternative embodiment of an interconnect assembly 1030 including an interposer 1032, a wafer 1050 supported on a base 1044 and a wafer contactor 1036. Wafer contactor 1036 is supported in housing assembly 1034. Interposer 1032 comprises a substrate 1040 and a plurality of contact elements 1046 on the top of substrate 1040, and another set of contact elements 1048 attached to the bottom of substrate 1040.

Interposer 1032 is a fully floating interposer, which is positioned away from all stops or supports once fully assembled. Resilient contact elements 1046 and 1048 provide opposing forces (from wafer contactor 1036 and wafer 1050, respectively) in order to maintain this position. The excessive movement of interposer 1032 toward either wafer 1050 or wafer contactor 1036 is arrested by placement constraints 1042 and 1038, respectively. In this instance, the addition of stops similar to 1014 of FIG. 3a may be necessary to control the deformation of the substrate at a point away from the locating structures 1042 and 1038.

Substrate 1004 (of FIG. 3a) or 1040 (of FIG. 3b) may be made of many materials, including for example, an organic dielectric such as printed circuit board (PCB) materials, silicon, insulator coated metal sheeting, metal matrix composites, glasses or ceramics. In certain applications, it would be desirable to form the substrate 1004 from silicon. This is particularly helpful in an assembly, which will be in close contact with an operating semiconductor device. Such devices generally become warm during use, or perhaps during testing, and it is very helpful to connect to materials which have a similar coefficient of thermal expansion so the active device and the contactor remain in a similar geometrical relationship. Matching a silicon device to another silicon devise is particularly desirable.

Figure 4A:
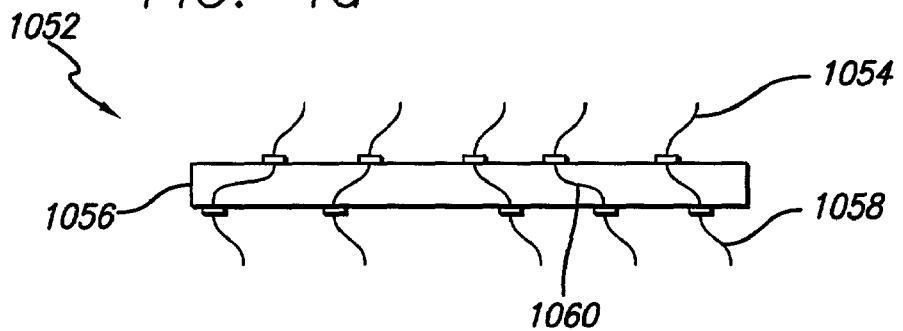
FIG. 4a shows an interposer with identical set of resilient contact elements on both surfaces thereof, but also including displacement of contacts so that the relationship between upward and downward contacts is not 1:1 in accordance with an embodiment of the present invention.
Figure 4B:
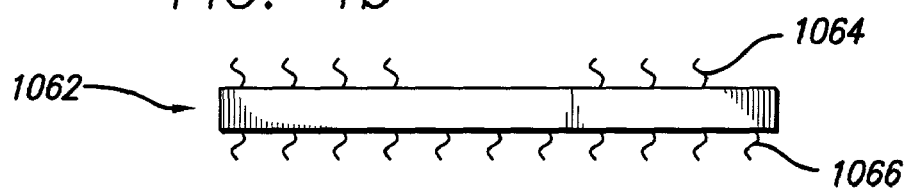
FIG. 4b shows an interposer with different sets of resilient contact elements on both surfaces thereof, according to the present invention but including pitch spreading from one set of resilient contacts to the other.

FIG. 4a shows an interposer 1052 wherein the resilient contact elements 1054 on the top surface of the substrate 1056 are similar in construction but displaced laterally with respect to the resilient contact elements 1058 on the bottom surface of the substrate 1056. Also shown in FIG. 4a are conducting traces 1060 through which electrical contact is established between the resilient contact elements on the top and bottom surfaces of the substrate. FIG. 4b shows a different embodiment of an interposer 1062. The resilient contact elements 1064 on the top surface of the interposer are shown to be constructed differently and at a different lateral separation than the resilient contact elements 1066 on the bottom surface of interposer 1062. In the interposer of FIG. 4b, the lower surface of interposer 1062 may contact a standard electronic device such as a contactor while the upper surface of interposer 1062 is customized to mate with a specific electronic device. Accordingly, different designs of the contact elements mounted on an interposer as described hereinabove fall within the scope and spirit of the present invention. Such designs enable different types of electronic components to be interconnected.

Figure 4C:
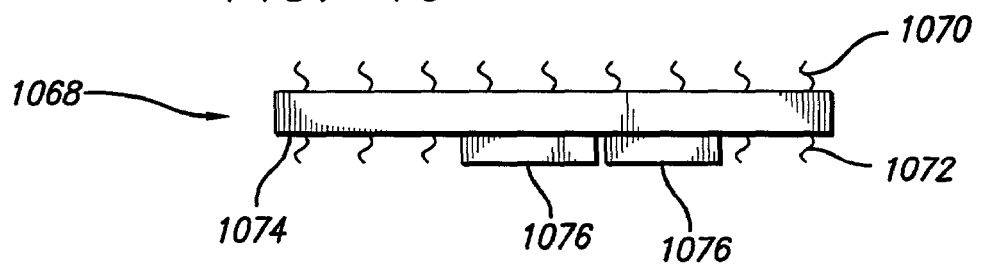
FIG. 4c shows an interposer including passive components on the lower surface of the interposer substrate in accordance with an embodiment of the present invention.

FIG. 4c shows an alternative embodiment of an interposer 1068. The resilient contact elements 1070 on the top surface of interposer 1068 are shown to be connected in a not 1:1 relationship with those elements 1072 on the bottom surface 1074 of the interposer. In FIG. 4c the interposer substrate may contain wiring layers for power and ground distribution, allowing coupling of signals between multiple devices on the wafer under test, etc. Additionally, passive or active components 1076 may be attached to bottom surface 1074. Alternatively, techniques known in the art for placing passive components such as resistors, capacitors or inductors, within the wiring substrate 1068, e.g. "embedded passives" may be used.

Figure 4D:
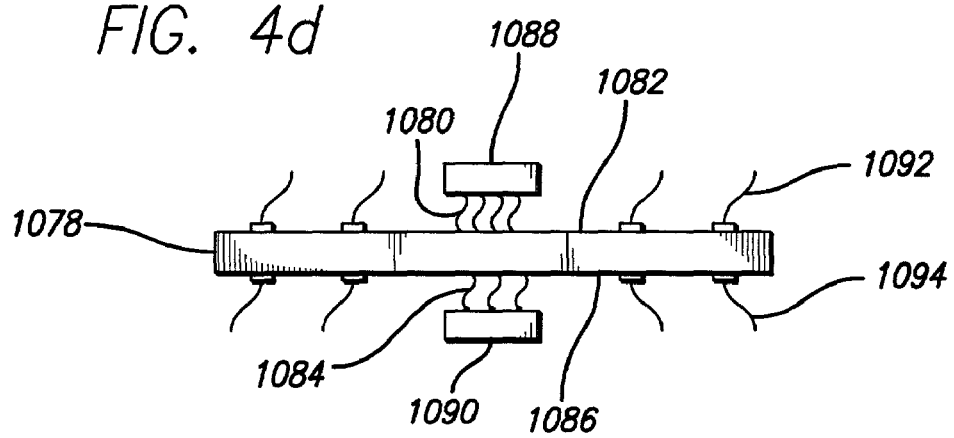
FIG. 4d shows an interposer including components on both sides of the interposer substrate in accordance with an embodiment of the present invention.

FIG. 4d shows a different embodiment of an interposer 1078. Resilient contact elements 1080 on the top surface 1082 of interposer 1078, as well as resilient contact elements 1084 on the bottom surface 1086 of interposer 1078 are shown to be respectively connected to passive or active components 1088 and 1090, which are attached to (or alternatively, though not shown, may be embedded in) the interposer substrate. Capacitive elements for decoupling and/or resistive elements for isolation or termination may be included with the interposer substrate. Resilient contact elements 1092 and 1094 are also located on the top surface 1082 and bottom surface 1086 of interposer 1078 to enable electrical connection of the substrate for contacting semiconductor devices.

By way of further explanation, in one type of an interposer, the position of the contact elements located on the top surface of the interposer (e.g., as discussed in connection with FIG. 3a, contact elements 1008) are essentially directly above the position of the contact elements located on the bottom surface of the interposer (in FIG. 3a, contact elements 1006). In alternative embodiments (e.g., in FIG. 4b), the positions of the top and bottom contact elements of an interposer may not be aligned vertically. For example, corresponding contacts may be at identical x-y coordinates, with different z values relative to the interposer. In alternative embodiments, contact elements of an interposer are re-positioned so that there is correspondence but different spacing between the location of the "top" and the location of corresponding "bottom" contact elements.

Figure 5:
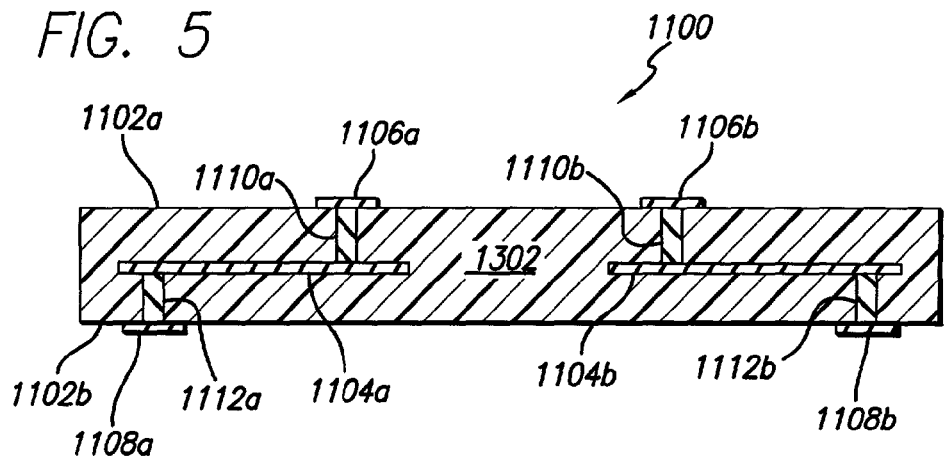
FIG. 5 is a cross-sectional view of an embodiment of a generic space transformer in accordance with an embodiment of the present invention.

It should also be appreciated that the interposer may also function as a space transformer, to translate one pitch (distance from one contact element to another) to another pitch on respective faces of the substrate. In FIG. 5, a space transformer 1100 is shown wherein the desired space-transforming is accomplished by the substrate 1102 of the space transformer. Alternatively, or in addition to this repositioning, it is possible to shape or position the individual resilient contact structures (not shown) attached thereto. (More detail is provided in FIG. 23 and discussions relating thereto of U.S. Pat. No. 5,917,707, entitled "Contact Structure for Interconnections, Interposers, Semiconductor Assembly," the disclosure of which is incorporated herein by reference as though set forth in full).

Space transformer substrate 1102 has a top (as viewed) surface 1102a and a bottom (as viewed) surface 1102b and is preferably formed as a multi-layer component having alternating layers of insulating material (e.g., ceramic) and conductive material. In this example, one wiring layer is shown as including two (of many) conductive traces 1104a and 1104b.

A plurality (two of many shown) of terminals (contact pads) 1106a and 1106b are disposed on top surface 1102a of space transformer substrate 1102 at a relatively fine pitch (relatively close to one another). A plurality (two of many shown) of terminals (contact pads) 1108a and 1108b are disposed on bottom surface 1102b of space transformer substrate 1102 at a relatively coarse pitch (relative to terminals 1106a and 1106b); i.e., further apart from one another). For example, bottom terminals 1108a and 1108b may be disposed at about 50-100 mil or 1.2-2.5 millimeter pitch (comparable to printed circuit board pitch constraints), and top terminals 1106a and 1106b may be disposed at about 1-10 mil or 0.025-0.250 millimeter pitch (comparable to the center-to-center spacing of semiconductor die bond pads), resulting in a 50:1 pitch-transformation. Top terminals 1106a and 1106b are connected to the corresponding bottom terminals 1108a and 1108b, respectively, by associated conductors 1110a/1112a and 1110b/1112b, respectively, connecting the terminals to the conductive traces 1104a and 1104b, respectively. This is all generally well known, in the context of multi-layer land grid array (LGA) support substrates, and the like. For a more detailed discussion of space transformers, the reader is directed to U.S. Pat. No. 5,974,662, entitled "Method of Planarizing Tips of Probe Elements of a Probe Card Assembly," issued on Nov. 2, 1999, the disclosure of which is herein incorporated by reference as though set forth in full. Alternatively, an interposer of the present invention may include a different pad pattern on one surface (i.e. "top" surface) than the other surface (i.e. "bottom" surface) with or without a change in pitch.

In the case of the use of semiconductors, through-holes are made through the semiconductor device for connection of the corresponding contact elements. Commonly assigned U.S. patent application Ser. No. 09/205,502 entitled "Socket For Mating With Electronic Component, Particularly Semiconductor Device With Spring Packaging, For Fixturing, Testing, Burning-In or Operating Such A Component", the disclosure of which is incorporated herein as though set forth in full, discusses making such through-holes. In this application, particular attention is directed to FIGS. 4a-4f, which are presented herein as FIGS. 6a to 6f.

Figure 6A:
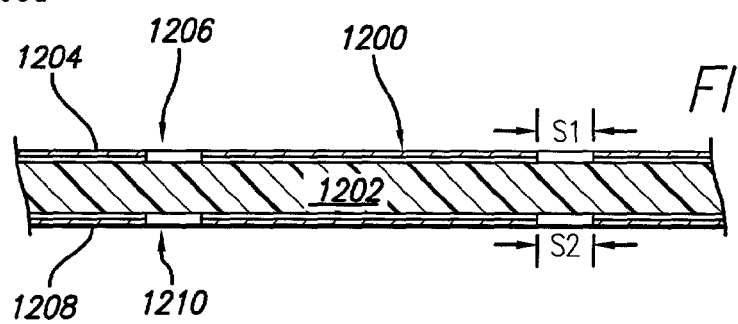

FIGS. 6a to 6f show side cross-sectional views illustrating fabricating hourglass-like through holes in a semiconductor substrate. FIG. 6a illustrates a first step of the process of one embodiment of the present invention. A layer 1204 of nitride is applied to a front surface of a substrate 1202 which is a piece of 1,0,0 silicon. The layer of nitride is patterned to have openings 1206. These openings 1206 may be square, having cross-dimensions (S1) of about 150-250 μm, such as about 200 μm. In a similar manner, a layer 1208 of nitride is applied to a back surface of the substrate 1202 and is patterned to have openings 1210. Openings 1210 in the nitride layer 1208 may be square, having cross-dimensions (S2) of about 150-250 μm, such as about 200 μm. Selected ones and in general, each, of openings 1206 is located directly opposite a corresponding one of openings 1210. A pair of aligned openings 1206 and 1210 will determine the location of a through-hole terminal formed in silicon substrate 1202. Openings 1206 and 1210 are illustrated as having the same cross-dimension as one another (i.e., S1=S2), but as will be discussed herein below, this is not necessary and may not be preferred in some implementations.

In one preferred embodiment, openings equivalent to openings 1206 and 1210 are rectangular rather than square. Opposing openings can have rectangles oriented in parallel, or opposing openings could be orthogonal. In general, a rectangular opening will create a trough structure rather than a point when etched. The relative dimensions of each need not be the same.

Figure 6B:
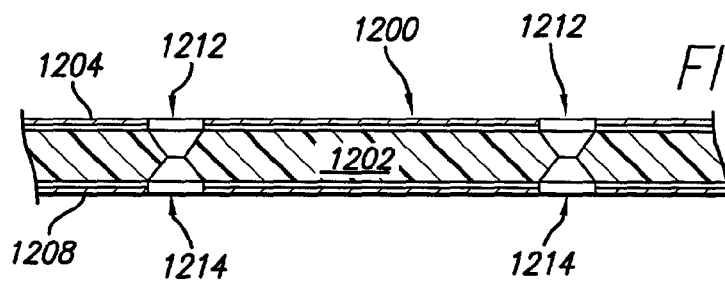

FIG. 6b illustrates a next step wherein the substrate 1202 is etched within openings 1206 and 1210, nitride layers 1204 and 1208 acting as masking material to prevent etching other than at openings 1206 and 1210. A suitable etchant is potassium hydroxide (KOH). Other suitable etching agents include NaOH and strong bases. A feature of 1,0,0 silicon is that it will etch in a strong base solution at an angle, the angle being 53.7°. The etch proceeds according to the crystal lattice of the silicon. Thus, it is preferred that openings 1206 and 1210 be oriented to align with the crystal lattice. The orientation of the lattice is known and generally indicated by a notch in the generally circular wafer of silicon.

Etching from only one side may give a pyramid shaped pit extending into that side of the substrate if the etching process is stopped prior to reaching a pointed pyramidal feature. The dimensions of the pit are controlled by the dimension and orientation of the opening within which the etching occurs, and the etch angle of 1,0,0 silicon. The etching comes to a halt when there is no remaining exposed silicon on the surface of the substrate. In general, starting with a square opening, a pyramid-shaped pit is created. If the etch is not driven to completion, a truncated pyramid can be formed. Where the opening for etching is rectangular, a trough structure will be formed.

In a preferred embodiment, etching is from both sides, and two pyramid-shaped pits 1212 and 1214 (as shown in FIG. 5b) "grow" toward one another. By ensuring that the openings are sufficiently wide, and the substrate is sufficiently thin, pyramid-shaped pits 1212 and 1214 will grow into one another (overlap), resulting in the "hourglass-shaped" through-holes illustrated in FIG. 6b. If desired, the pits may be allowed to "over-etch" so that nitride layers 1204 and 1208 slightly overhang the pit openings. Once etching is done, nitride layers 1204 and 1208 may be removed, by preferential etching.

Etching this hourglass forms a "via" in the silicon substrate. Vias are widely used in many electronic products such as semiconductor devices and multilayer substrates. This new via will be made electrically conducting, then can be used in many of the ways known for using vias.

Figure 6C:
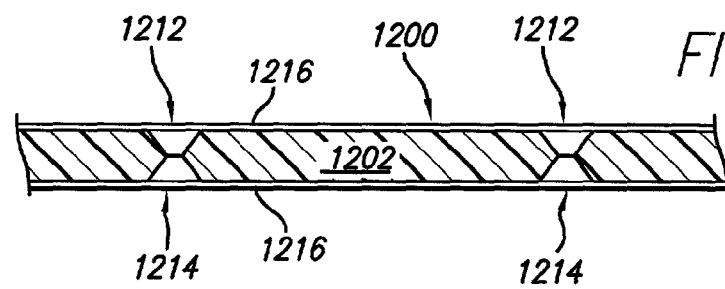

FIG. 6c illustrates a next step wherein substrate 1202 is re-nitrided, such as by thermally growing a very thin layer 1216 of nitride on all the surfaces of substrate 1202, including within the sidewalls of pits 1212 and 1214. This nitride functions in part to insulate the body of the semiconductor substrate from any subsequently applied conductive material. Alternatively, a layer of silicon oxide, or other organic or inorganic insulating coating may be applied to the substrate.

Figure 6D:
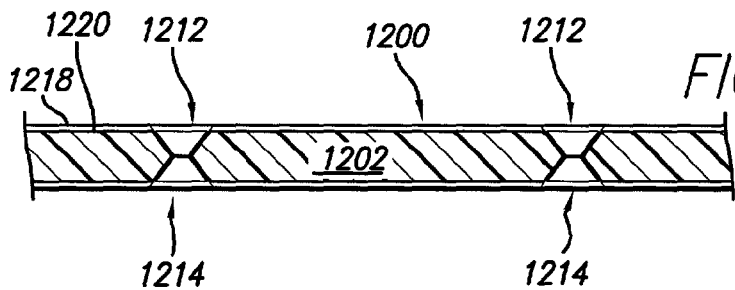

FIG. 6d illustrates a next step wherein the entire substrate 1202 is coated (e.g., sputter-coated) with a thin layer 1218 of titanium-tungsten (TiW), then a thin seed layer 1210 of gold (Au). Representative dimensions and useful methods and materials are set forth in detail in co-pending, commonly assigned U.S. patent application Ser. No. 09/032,473, filed Feb. 26, 1998, entitled "Lithographically Defined Microelectronic Contact Structures," the disclosure of which is incorporated herein by reference as though set forth in full.

FIG. 6e illustrates a next step wherein layer 1230 of masking material, such as photoresist, is applied to both sides of substrate 1202 and patterned to have openings aligned with pits 1212 and 1214. The seed layer 1220 within the pits is not covered by the masking material. Then, one or more layers of a conductive material 1232, such as nickel, copper or gold, is deposited, such as by plating, onto exposed seed layer 1220 within pits 1212 and 1214.

FIG. 6f illustrates a next (final) step wherein masking layer 1230 is removed (such as by rinsing off), and the unplated part of seed layers 1218 and 1220 are removed (such as by selective chemical etching), leaving conductive material 1232 within and bridging pits 1212 and 1214, thereby forming a conductive via through substrate 1202. This provides electrical continuity between pit 1212 and pit 1214. At the same time as the vias are metallized, traces may be patterned on the opposing faces of the substrate to allow for more functionality or redistribution. Further details of an interposer substrate with through-hole type terminal can be found in the aforementioned U.S. patent application Ser. No. 09/205,502.

FIG. 6g illustrates an interim temporal step in the process just described. When pits 1212 and 1214 (see FIG. 6b) are first being etched, they "grow" towards one another. In the case that openings 1206 and 1210 (see FIG. 6a) have the same cross-dimension (both are "S1"), the growing pits should be symmetrical with one another, one being the mirror image of the other, as illustrated.

FIG. 6h illustrates an interim temporal step (compare FIG. 6g) in the process, in a case where openings 1206 and 1210 (see FIG. 6a) do not have the same cross-dimension, for example, opening 1206 has a larger cross dimension than opening 1210 (i.e., S1/S2). Here, it can be observed that pits 1244 and 1246 (compare 1212 and 1214) grow into substrate 1242 (compare 1202) at the same rate, but that pit 1246 has reached its apex and terminated its growth. Pit 1244 will continue growing until etch self-terminates. The designer can select a thickness of substrate 1202 and dimensions of openings 1206 and 1210 to permit this etching pattern, or another selected etching pattern.

FIG. 6i illustrates an interposer substrate 1252 (compare 1242) wherein the process has started with openings (compare 1206 and 1210) that do not have the same cross-dimension, as in the case discussed with respect to FIG. 6h. Here it can be observed that pit 1254 (compare 1244) is wider and deeper than pit 1256 (compare 1246). FIG. 6i also illustrates the conductive material 1258 deposited onto the seed layers (not shown) in pits 1254 and 1256.

Figure 7A:
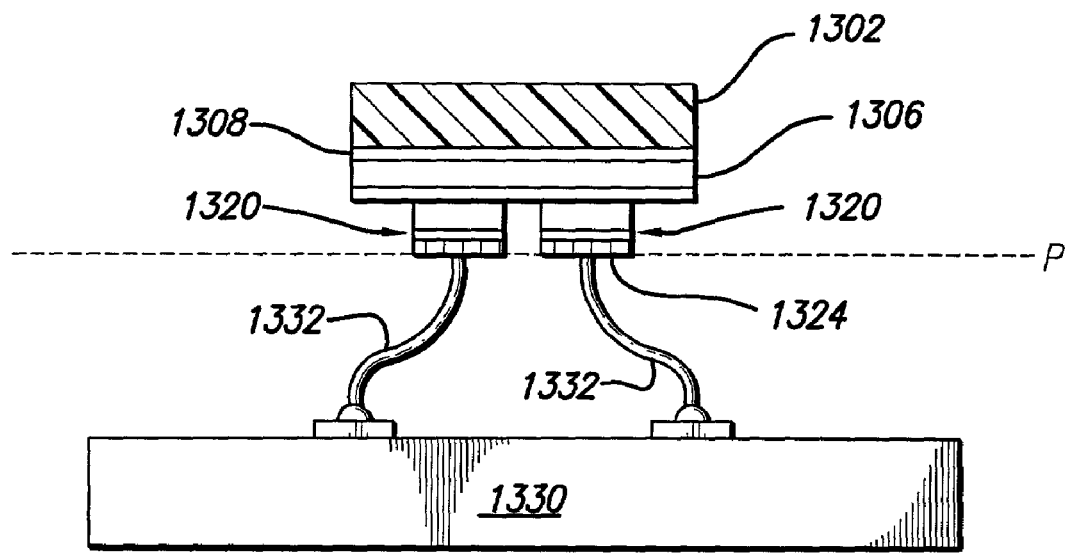
FIG. 7a is a side view of an electronic component being joined with tip structures in accordance with an embodiment of the present invention.

For certain resilient contact elements, as used in the interposer (or space transformer) embodiments of the present invention, a tip structure can be fabricated as an end of each interconnect element. As shown in FIG. 7a, tip structures 1320 (only two tip structures are shown in the view of FIG. 7a, for illustrative clarity) are aligned with the tips of the interconnection elements (contact element) 1332, using standard flip-chip techniques (e.g., split prism), and the assembly is passed through a brazing furnace to reflow the joining material 1324, thereby joining (e.g., brazing) the prefabricated tip structures 1320 to the ends of the interconnection elements 1332.

Figure 7B:
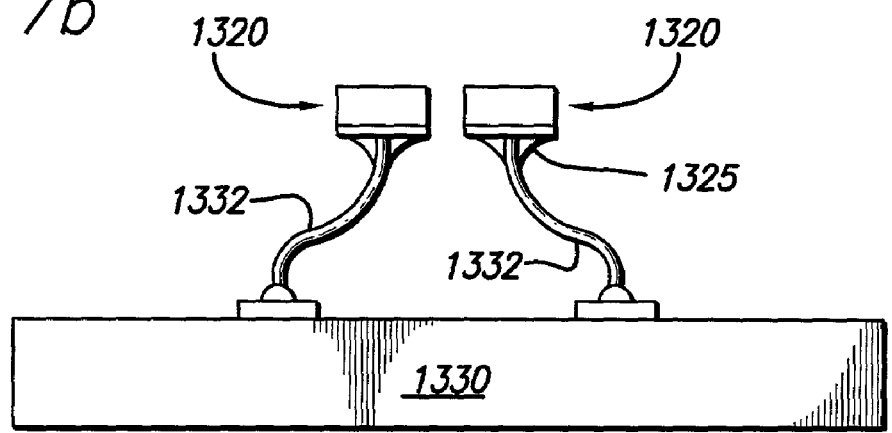
FIG. 7b is a side view of a further step in joining an electronic component with tip structures in accordance with an embodiment of the present invention.

With respect to the fabrication of composite interconnection elements having prefabricated tip structures, FIG. 7a, shows the fabrication method at a certain step prior to tip attachment. As shown in FIG. 7a, a silicon substrate or wafer 1302 is used as a sacrificial substrate. A layer of titanium 1308 is deposited on the top surface of substrate 1302, and a layer of aluminum 1306 is deposited atop titanium layer 1308. A layer of copper 1310 is deposited atop aluminum layer 1306. The aluminum layer serves as a release layer. Using a suitable etchant, the aluminum is preferentially (to the other materials of the assembly) etched away, and the silicon substrate 1302 simply "pops" off, resulting in an electronic component having interconnection elements, each having a prefabricated tip structure, as illustrated in FIG. 7b. Note that the joining material 1324 has reflowed as "fillets" 1325 on end portions of the interconnection elements 1332. In a final step of the process, the residual copper (1308) is etched away, leaving tip structure 1320 with a desired contact metallurgy exposed for making pressure connections to other electronic components. Alternatively, the brazing (soldering) paste 1324 is omitted, and instead, a layer of eutectic material (e.g., gold-tin) is plated onto the resilient interconnection elements prior to mounting the contact tips (1320) thereto.

More detail regarding this tip attachment can be found in the U.S. Pat. No. 5,829,128, entitled "Method of Mounting Resilient Contact Structures to Semiconductor Devices." It is within the scope of this invention that this technique can be used to join (e.g., braze or solder) pre-fabricated tip structures to ends of non-resilient interconnection elements, resilient interconnection elements, and composite interconnection elements, which are fabricated directly upon the terminals of the semiconductor device. Other structures of and techniques for fabricating tip structures using sacrificial substrates are disclosed in U.S. Pat. No. 5,994,152, entitled "Fabricating Interconnects and Tips Using Sacrificial Substrate," issued on Nov. 30, 1999, to Khandros et al., the disclosure of which is herein incorporated by reference as though set forth in full.

Figure 8A:
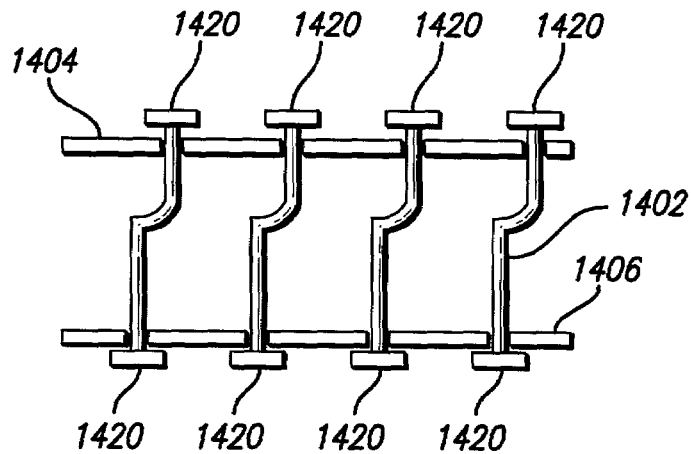
FIG. 8a is a side, cross-sectional view of an embodiment wherein the contact tip structures of the present invention are affixed to a type of elongate interconnection elements in accordance with an embodiment of the present invention.
Figure 8B:
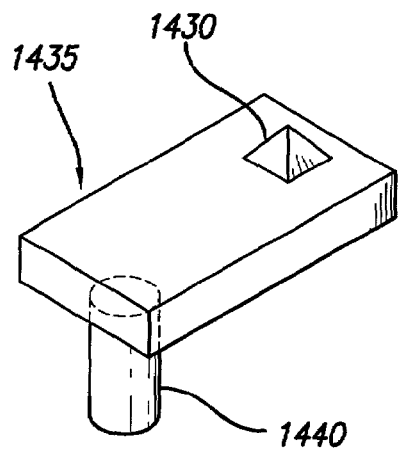
FIG. 8b is a perspective view of a contact tip structure, which has been joined to an interconnection element in accordance with an embodiment of the present invention.
Figure 8C:
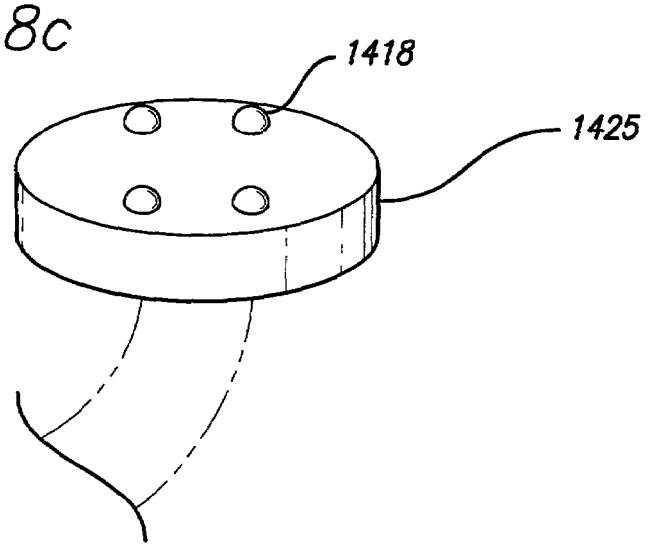
FIG. 8c is a perspective view of a contact tip structure joined to an end of an interconnection element in accordance with an embodiment of the present invention.

In FIGS. 8a, 8b and 8c, contact tip structures that can be integrated into the present interposer are shown. Further contact tip structures and discussions and figures in association thereto are presented in commonly assigned U.S. patent application Ser. No. 08/819,464, entitled "Contact Tip Structures For Microelectronic Interconnection Elements And Methods of Making Same," filed on Mar. 17, 1997, the disclosure of which is herein incorporated by reference as though set forth in full. In FIG. 8a, a contact tip structure 1420 is shown to have a flat contact surface. These contact tips are shown as integrated onto a "cobra" type buckling beam assembly adapted for use as interposer structure. For many pressure contact applications, a spherical or very small surface area contact tip urging against a nominally flat-surfaced terminal of an electronic component is preferred. In other applications, the surface of the contact tip structure will preferably have projections in the shape of a pyramid, a truncated pyramid, a cone, a wedge, or the like. Techniques for fabrication of such contact tip structures are presented in the aforementioned application Ser. No. 08/819,464.

In FIG. 8b, one of the plurality of elongate contact tip structures 1435 is shown with each structure having a projecting pyramid-shaped contact feature 1430 projecting from a surface thereof. It is this projecting contact feature that is intended to make the actual contact with a terminal (not shown) of an electronic component (not shown).

As shown in FIG. 8b, the pyramid-shaped contact feature 1430 may be suitably polished (abraded) off, which will configure the pyramid-shaped feature as a truncated pyramid-shaped feature. The relatively small flat end shape (e.g., a square measuring a few tenths of a mil on a side, on the order of 1-10 microns), rather than a truly pointed end shape, will in many applications be sufficiently "sharp" to make reliable pressure connections with terminals (not shown) of electronic components (not shown), and may tend to wear better than a truly pointed feature for making repeated (e.g., thousands of) pressure connections to electronic components, such as might be expected in an application of the tipped interconnection elements of the present invention for a wafer-level contactor. The desired tip shape and feature definition will depend on the nature of both the contact tip and the mating surface material and morphology. Design of these mating contact elements for optimum performance would have to be undertaken as part of the overall design exercise associated with building the interposer assembly itself.

As shown in FIG. 8c, in subsequent processing steps wherein a contact tip structure is fabricated (such as described in the aforementioned patent application Ser. No. 08/819,464), one or more (four shown) "dimple" contact features 1418 project from the main body of the resulting contact tip structure 1425.

There are several variations of the "dimple" contact features 1418. For example, resilient contact structures can be fabricated on the base 1425 with tips of various shapes and distances from their bases. Alternatively, it is possible to reposition the contact structures on the base 1425 by providing conductive traces so that the base is moved away from a primary position to a desired location.

One useful embodiment of an interposer embodiment of the present invention having two different contact pad patterns, as described hereinabove, is for mating with two different designs of components, i.e. components with different types of terminals. That is, in one embodiment of the present invention, one surface of the interposer (such as the "top" surface) includes a truncated pyramid contact pads and an opposite surface of the interposer (the "bottom surface) includes cone-shaped contact pads. Any of the various types of contact pads, as recited in the application Ser. No. 08/819,464 or known to those of skill in the art, may be integrated into the various embodiments, discussed herein, of the present invention interposer.

Commonly assigned U.S. Pat. No. 5,829,128 (the "128 Patent"), entitled "Method of Mounting Resilient Contact Structures To Semiconductor Devices" and issued to Eldridge et al. on Nov. 3, 1998, discloses substrates with conductive material. The disclosure of this patent document is herein incorporated by reference as though set forth in full. The '128 Patent teaches exemplary substrates upon which resilient interconnect elements are fabricated. In particular, in FIGS. 8a-8e, there is disclosed a silicon wafer used as the sacrificial substrate upon which tip structures are fabricated, and that tip structures so fabricated may be joined (e.g., soldered, brazed) to resilient contact structures that already have been mounted to an electronic component.

There is further disclosed in the '128 Patent resilient contact structures, as shown in FIG. 7a, wherein a "dead space" is used to position an electrical component such as a decoupling capacitor. This concept of piggybacking passive (such as capacitors and resistors) and/or active components between a substrate and a wafer and between a substrate and a wafer contactor is integrated into an embodiment of the present invention, as shown in and discussed in connection with FIGS. 9a and 9b herein.

Figure 9A:
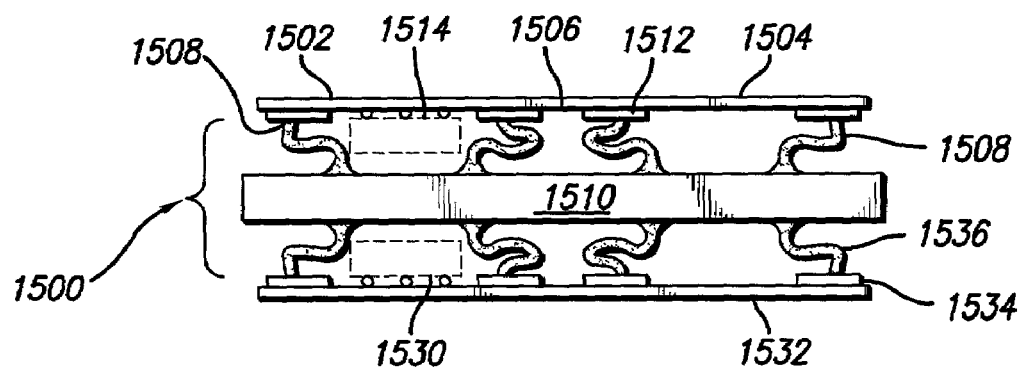
FIG. 9a shows an interconnect assembly including an interposer having a plurality of passive and/or active elements in accordance with an embodiment of the present invention.

In FIG. 9a, an interposer 1500 is shown connected to a plurality (two of many shown) of semiconductor devices (dies) 1502 and 1504 prior to singulating (separating) the devices from a semiconductor wafer (wafer not shown in FIG. 9a). A boundary between the two devices is indicated by the notch 1506. (The notch may or may not actually exist, and represents the position of a kerf (line) where the wafer will be sawed to singulate the devices.)

In FIG. 9a, the interposer 1500 is further shown to include an interposer substrate 1510 having a plurality of resilient contact elements 1508 disposed on a top surface of the substrate 1510 and a plurality of resilient contact elements 1536 disposed on a bottom surface of the substrate 1510. The contact elements 1508 and 1536 are fabricated on the substrate 1510 in manners as described and/or incorporated by reference hereinabove. The wafer on which the devices 1502 and 1504 are disposed includes terminals 1512 for being brought into mechanical and electrical contact with the contact elements 1508. A wafer contactor 1532 has disposed thereon a plurality of contact pads 1534 for being brought into mechanical and electrical contact with the contact elements 1536. The wafer on which the devices 1504 and 1502 are disposed is brought to bear against the substrate 1510, or vice-versa, so that each of the contact pads 1512 effects a pressure connection with a corresponding one of the resilient contact elements 1508. Similarly, the wafer contactor 1532 is brought to bear against the substrate 1510, or vice-versa, so that each of the contact pads 1534 effects a pressure connection with a corresponding one of the resilient contact elements 1536. In this manner, a technique is provided for performing burn-in of unsingulated semiconductor devices in wafer form.

The substrate 1510 can be of any of the materials discussed hereinabove, such as a printed circuit board (PCB), ceramic or silicon.

The wafer (devices 1502, 1504 and additional devices) is aligned with the substrate 1510, using any suitable alignment means (such as locating pins, not shown) so that each resilient contact element 1508 bears upon a corresponding pad 1512. Similarly, the wafer contactor 1532 is aligned with the substrate 1510 using any suitable alignment means so that each resilient contact element 1536 bears upon a corresponding pad 1534.

Figure 9B:
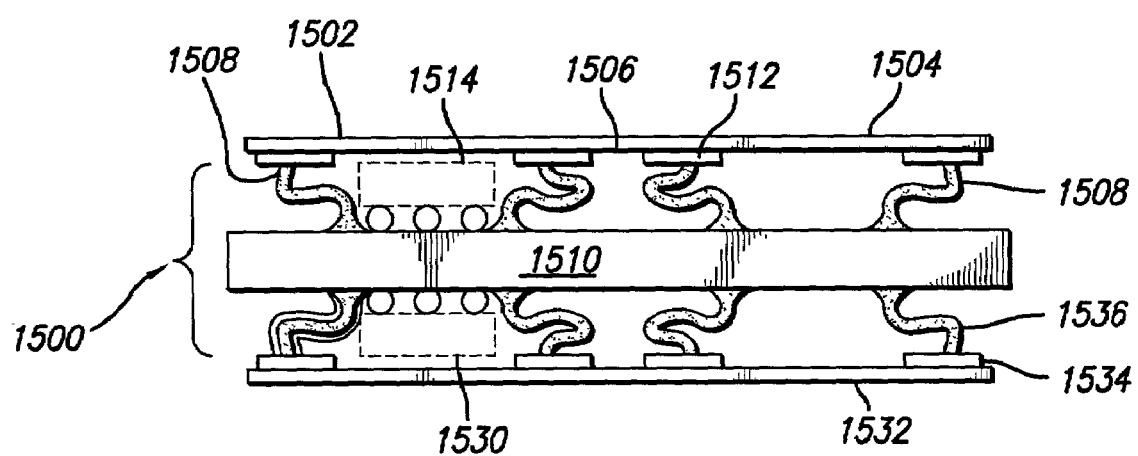
FIG. 9b shows an interconnect assembly including an assembly having a plurality of passive and/or active elements mounted on the die and the wafer contactor in accordance with an embodiment of the present invention.

An important advantage accruing to the interposer 1500 illustrated in FIG. 9*a* is that the resilient contact elements 1508 and 1536 stand on their own (disassociated from one another), and can be fabricated to extend to a significant distance from the substrate 1510. This is important, in that it provides an appreciable "dead space" both between the resilient contact elements 1508 (and similarly between the resilient contact elements 1536) and between the opposing surfaces of the die (e.g., 1502) and the substrate 1510 (and similarly between the opposing surfaces of the wafer contactor 1532 and the substrate 1510). "Dead space" 1514 and "dead space" 1530 are disposed, as shown in dashed lines, on either surface of the substrate 1510. In many semiconductor applications, it is beneficial to provide decoupling capacitors as close to interconnections as possible. According to the present invention, there is ample space for decoupling capacitors to be located in the otherwise "dead spaces" 1514 and 1530. As depicted in FIG. 9*a*, such decoupling capacitors can be mounted to the wafer on which the die 1502 and 1504 are disposed and/or to wafer contactor 1532. As is shown in FIG. 9*b*, the decoupling capacitors or other components may be connected to substrate 1510 of interposer 1500. It should be appreciated that passive elements, other than capacitors, or in addition thereto, such as resistors, may be disposed in the "dead spaces" 1514 and 1530. Further, active elements may be disposed in the "dead spaces" 1514 and 1530.

For additional details of various types of contact elements (resilient and otherwise) for effecting pressure connections between electronic components, such as done in connection with the present invention, the reader is directed to commonly assigned U.S. patent application Ser. No. 08/819,464 entitled "Contact Tip Structures for Microelectronic Interconnection Elements," filed on Mar. 17, 1997, the disclosure of which is herein incorporated by reference as though set forth in full. Any of the various contact elements disclosed in the referenced document can be used as interconnection elements, e.g., interconnection elements 1006 and 1008 of FIG. 3.

Figure 1:
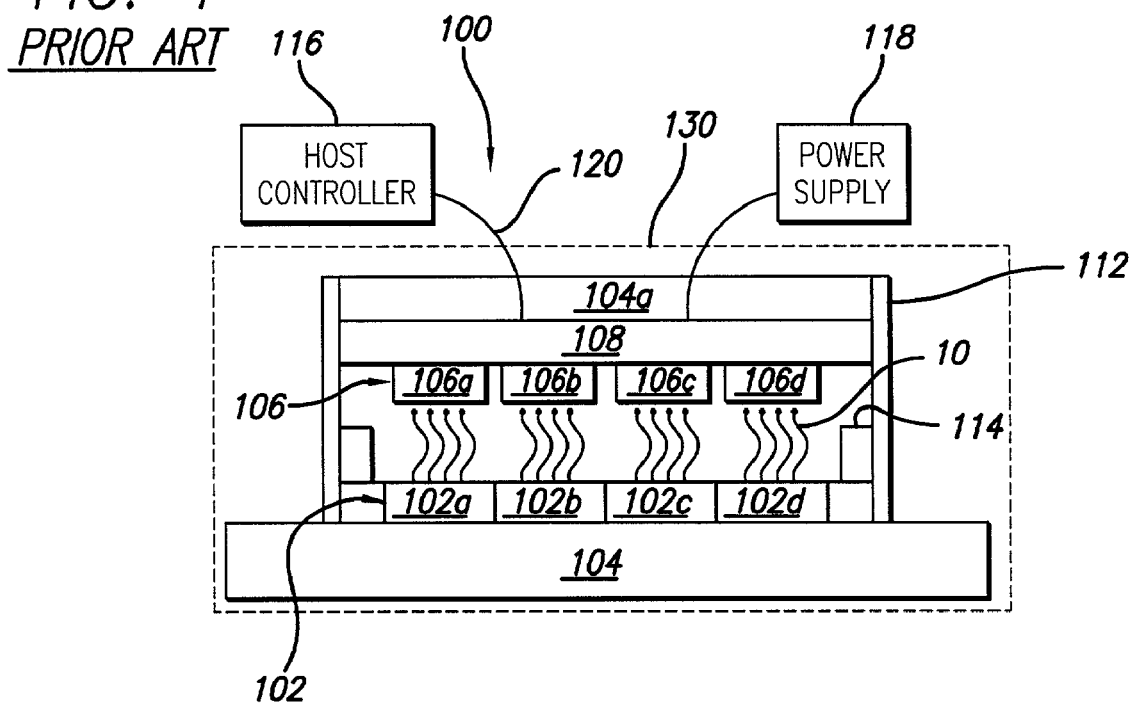
FIG. 1 shows a prior art test assembly for performing wafer-level burn-in and testing of semiconductor devices included on a test substrate.
Figure 2:
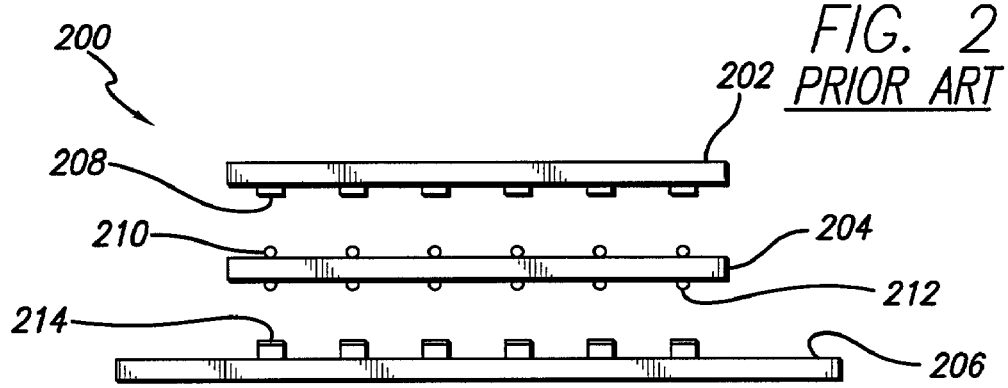
FIG. 2 illustrates a prior art test assembly including an interposer with solder balls attached to both surfaces thereof.

In one embodiment of the interposer of the present invention, microelectronic contact structures are fabricated lithographically. Examples of such contact structures and fabrication thereof are disclosed in detail in co-pending, commonly assigned U.S. patent application Ser. No. 09/032,473, referenced and incorporated hereinabove. In particular, FIGS. 2L and 2M of the referenced application, which are presented herein as FIGS. 10*a* and 10*b*, respectively, illustrate an assembly 1600 in which a free-standing contact structure 1660 is attached at its base end 1662 to an electronic component 1602, the main body portion 1666 of structure 1660 is positioned away from the surface of the electronic component 1602, and its tip end portion 1664 having a topography extending even farther from the level of the main body portion 1666. The sloped region 1663 of the base end 1662 of the resulting contact structure 1660 is clearly visible in these figures.

Figure 10A:
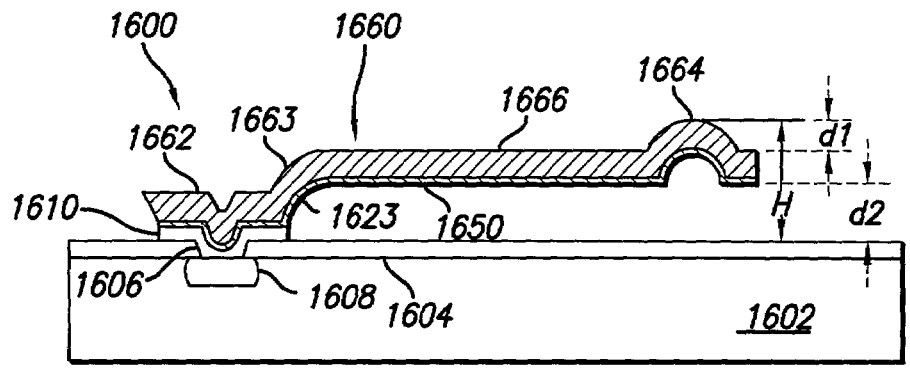
FIGS. 10a and 10b are side cross-sectional and perspective views, respectively, of a completed contact structure formed on an electronic component in accordance with an embodiment of a process for making a contact structure.
Figure 10B:
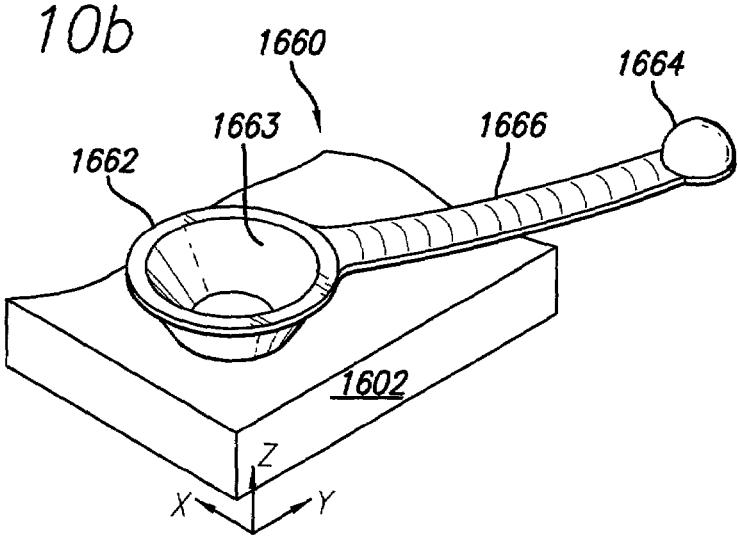

In FIGS. 10*a* and 10*b*, contact element 1666 is mounted on an electronic device comprising a silicon substrate 1602, a passivation layer 1604 disposed on the surface of the silicon substrate 1602 and an opening 1606 extending through the passivation layer 1604 to the metallic pad 1608. Commonly, there is a plurality of such contact pads on an electronic device.

Directly on top of substrate 1602, there is a passivation layer 1604 covering the surface of substrate 1602 except for contact pad 1608. Contact pad 1608 is disposed over the surface of substrate 1602.

Next, a layer of conductive material 1610 is deposited on top of the passivation layer. Conductive layer 1610 is in contact with contact pad 1608. Passivation layer 1604 assists in bonding conductive layer 1610 to passivation layer 1604.

Directly on top of conductive layer 1610, there is a seed layer 1650, with a curved portion 1623. The seed layer 1650, when patterned, serves as a precursor for a contact structure to be fabricated on the electronic device. The contact structure is in the form of an elongate mass of conductive material comprising a base end 1662, a main body portion 1666 and the tip end 1664. The main body portion 1666 of the contact structure is in a plane, which is approximately parallel to the surface of the substrate 1602. Contact structure 1660 is free-standing secured by its base 1662 to substrate 1602, with its tip end free to make contact with a terminal of another electronic device. Contact structure 1660 reacts to applied forces by resiliently and/or compliantly deflecting in any or all of the x, y and z axis. Further details of various types of contact elements and fabrication thereof are shown in the aforementioned U.S. patent application Ser. No. 09/032,473.

Figure 11:
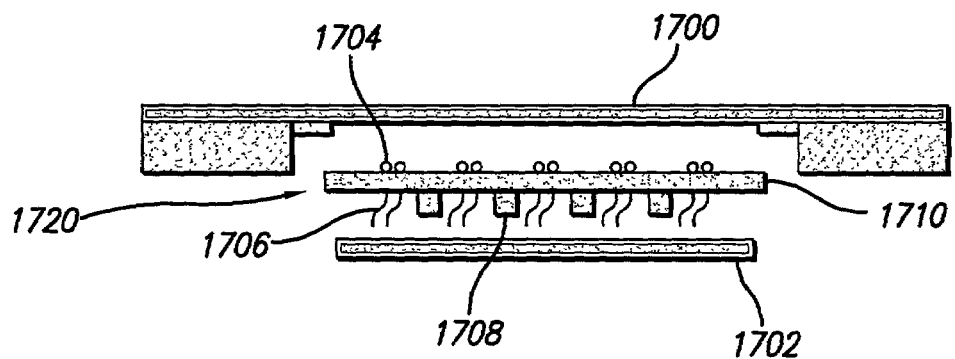
FIG. 11 shows an interposer having disposed a set of solder balls on one of its surfaces for interconnecting to another electronic component in accordance with an embodiment of the present invention.

FIG. 11 shows another embodiment of the interposer in accordance with the present invention. Interposer 1720 includes a plurality of solder balls 1704 disposed on the top surface of interposer substrate 1710 for establishing contact between interposer 1720 and the terminals or contact pads (not shown) of an electronic component 1700. Interposer 1720 also includes a plurality of resilient contact elements 1706, disposed on the bottom surface of substrate 1710 for establishing contact between interposer 1720 and the terminals or contact pads (not shown) of an electronic component 1702. In this manner, interposer 1720 permits mechanical and electrical contact between electronic components 1700 and 1702. Interposer substrate 1710 has disposed thereupon a plurality of compression stop structures 1708 for limiting compression of contact elements 1706 upon pressure contact applied between component 1700 and substrate 1710.

Figure 12:
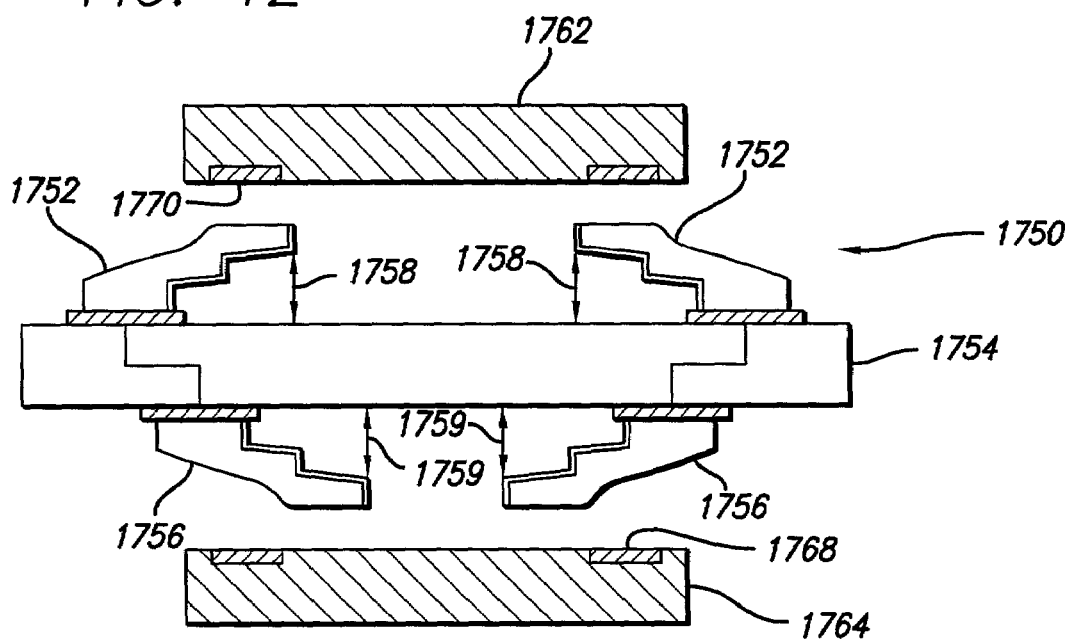
FIG. 12 shows an interposer having disposed on one of its surfaces a plurality of spring contact elements that are fabricated rather than composite in accordance with an embodiment of the present invention.

FIG. 12 shows yet another embodiment of the present invention wherein an interposer 1750 has disposed on one surface thereof (in FIG. 12, this surface is shown as the top surface of a substrate 1754) a plurality of spring contact elements 1752 that are fabricated using lithographic techniques. Methods for fabricating such contact elements are disclosed in commonly assigned U.S. patent application Ser. No. 08/802,054, and its corresponding PCT application WO 97/43656, the disclosure of which is herein incorporated by reference as though set forth in full. In this reference document, FIGS. 6a-6c particularly illustrate a technique for fabricating contact elements 1752.

In FIG. 12, contact elements 1752 bend to a compressed state in a direction as shown by directional arrow 1758 when the electronic component 1762 is pressed towards the substrate 1754. Additionally, contact elements 1756 bend to a compressed state in a direction shown by directional arrow 1759 when the electronic component 1764 is pressed towards the substrate 1754. The contact elements 1756 are shown to have a smaller pitch than the contact elements 1752. Components 1762 and 1764 include contact pads 1770 and 1768, respectively, for connecting to the contact elements 1752 and 1756.

Figure 13:
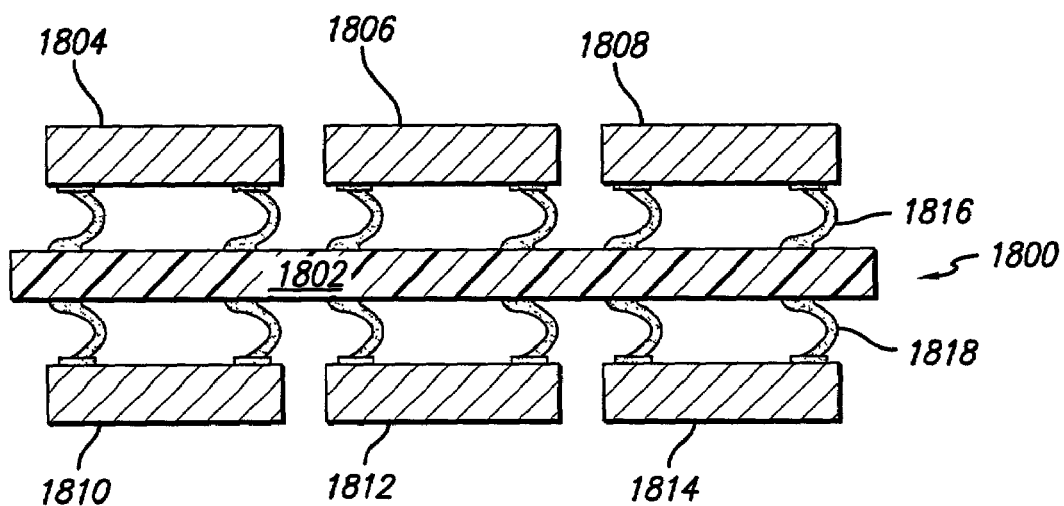
FIG. 13 shows an interposer interconnecting two sets of tile substrates in accordance with an embodiment of the present invention.

FIG. 13 depicts an interposer in accordance with an embodiment of the present invention. Interposer 1800 comprises an interposer substrate 1802, resilient contact elements 1816 and 1818, which are mounted on both sides of the substrate 1802, as well as two sets of tile substrates 1804, 1806 and 1808, and 1810, 1812 and 1814. One set of the tile substrates, tile substrates 1804, 1806 and 1808, are located atop of interposer substrate 1802, and the other set of the tile substrates, tile substrates 1810, 1812 and 1814, are located at the bottom of interposer substrate 1802.

The resilient contact elements (a plurality of resilient contact elements 1816, disposed on a top surface of the substrate 1802, through contact pressure with the top tiles, and a plurality of resilient contact elements 1818, disposed on a bottom surface of the substrate 1802, through pressure contact with the bottom tiles) connect the pair of tile substrates 1804 and 1810, and similarly connect the pairs 1806 and 1812, and 1808 and 1814. Tile substrates 1804, 1806 and 1808 may be part of an electronic component substrate such as a wafer (not shown in FIG. 13), including semiconductor devices or passive components. Similarly, tile substrates 1810, 1812 and 1814 may be an integral part of another electronic component, such as a wafer contactor, probe tester, or the like. As the two layers of the tile substrates (1804 and 1810, 1806 and 1812, and 1808 and 1814) are pushed towards each other the resilient contact elements 1816 and 1818 are compressed thereby exerting pressure and establishing electrical connection between the tiles substrates.

By way of further explanation, tile substrates, 1804, 1806 and 1808, may be disposed on a wafer and tile substrates 1810, 1812 and 1814 may be on a tester. Interposer 1800 permits the entire semiconductor wafer to be tested, probed or burned-in (generally referred to as "exercised") at the same time. Multiple die sites, corresponding to the substrate tile 1804, 1806 and 1808, on a semiconductor wafer are readily probed by employing the substrate tiles 1810, 1812 and 1814 via the interposer substrate 1802. In addition, substrate tiles on a tester, such as 1810, 1812 an 1814 may be arranged in order to optimize probing of an entire wafer.

Figure 14:
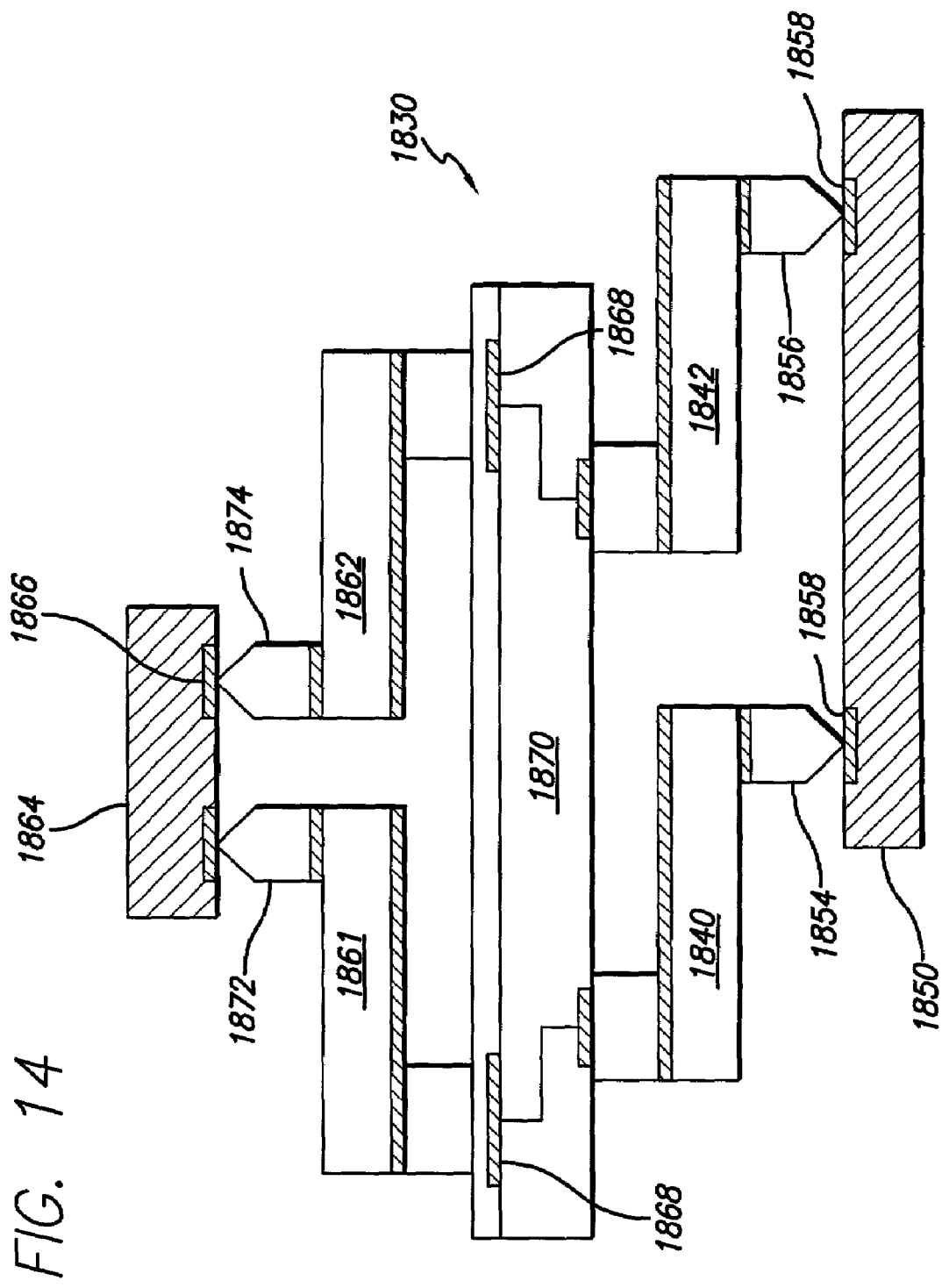
FIG. 14 shows an interposer wherein two different types of contact elements are employed on the top and bottom surfaces of the interposer in accordance with an embodiment of the present invention.

FIG. 14 shows yet another embodiment of an interposer in accordance with the present invention wherein two types of contact elements are employed on top and bottom surfaces of an interposer 1830 for making contact to two electronic components. In FIG. 14, at the top surface of the interposer substrate 1870, a plurality of contact elements 1861 and 1862 are affixed, for example, in the manner described with respect to FIG. 13c or FIG. 22b of commonly assigned PCT Application No. PCT/US99/28597, entitled "Lithographic Contact Elements" filed on Dec. 1, 1999, which claims priority to U.S. patent application Ser. No. 09/205,023 and "Lithographic Contact Elements," filed on Dec. 2, 1998, patent application Ser. No. 09/205,022 (the disclosures of which are herein incorporated by reference as though set forth in full), so that tip portion ends 1872 and 1874 make pressure connections with terminals 1866 of electronic component 1864, such as a semiconductor device, or an area of a semiconductor wafer (not shown) containing a plurality of semiconductor devices. Similarly, at the bottom of substrate 1870, a plurality of contact elements are affixed, two of which are shown to be 1840 and 1842. Tip structures 1854 and 1856 of the contact elements 1840 and 1842 make pressure connections with terminals 1858 of the electronic component 1850. Electronic component 1850 may be a wafer containing a plurality of semiconductor devices, a contactor, a test device or other electronic component described hereinabove. Thus, mechanical and electrical contact is established between the electronic components 1850 and 1864.

It should be apparent from the foregoing discussion that interposers may be designed to interconnect a wide variety of electronic components. By suitable choice of contact elements on both surfaces of the interposer, as can be appreciated, electronic components having different pitch, different lengths or different contact pads having diverse features may be interconnected using the apparatus and methods of the present invention.

Figure 15:
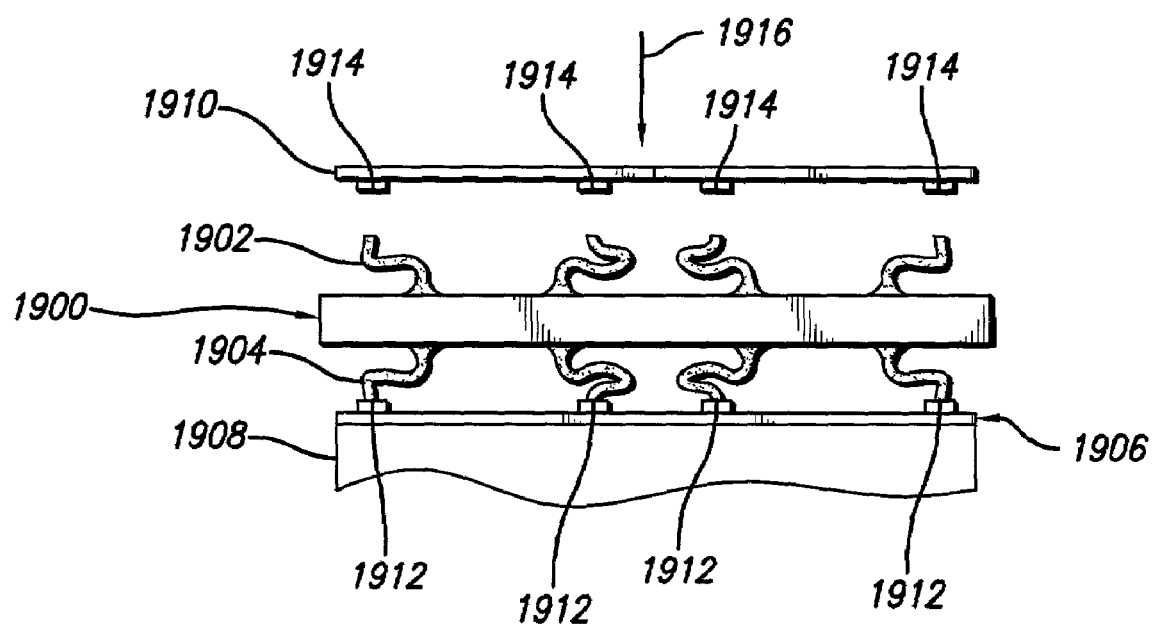
FIG. 15 shows an interconnect assembly including an interposer with the implementation of a pressure actuated contactor in accordance with an embodiment of the present invention.

As shown in FIG. 15, interposer 1900 can be implemented in conjunction with a pressure activated contactor. As depicted in FIG. 15, interposer 1900 has contact elements 1902 and 1904 disposed on each side, and the device under test is a complete semiconductor wafer 1906. Wafer 1906 is placed against a chuck 1908. A wiring substrate or layer 1910 is positioned above interposer 1900. Wafer 1906 includes a plurality of contact pads 1912 and wiring substrate 1910 includes a plurality of terminals 1914. Pressure, as indicated by directional arrow 1916 is utilized for enabling proper contact between interposer 1900 and wafer 1906, more specifically between contact elements 1904 and contact pads 1912, and between interposer 1900 and wiring substrate 1906, more specifically, between contact elements 1902 and terminals 1914. An exemplary pressure contact arrangement is discussed in commonly assigned U.S. patent application Ser. No. 09/376,759 entitled "Electrical Contactor, Especially Wafer Level Contactor, Using Fluid Pressure," filed on Aug. 17, 1999, the disclosure of which is herein incorporated by reference as though set forth in full. In this regard, it should be appreciated that various arrangements of stop structures, for example as discussed above in connection with FIGS. 3a and 3b, may be implemented in the arrangement of FIG. 15.

Figure 16:
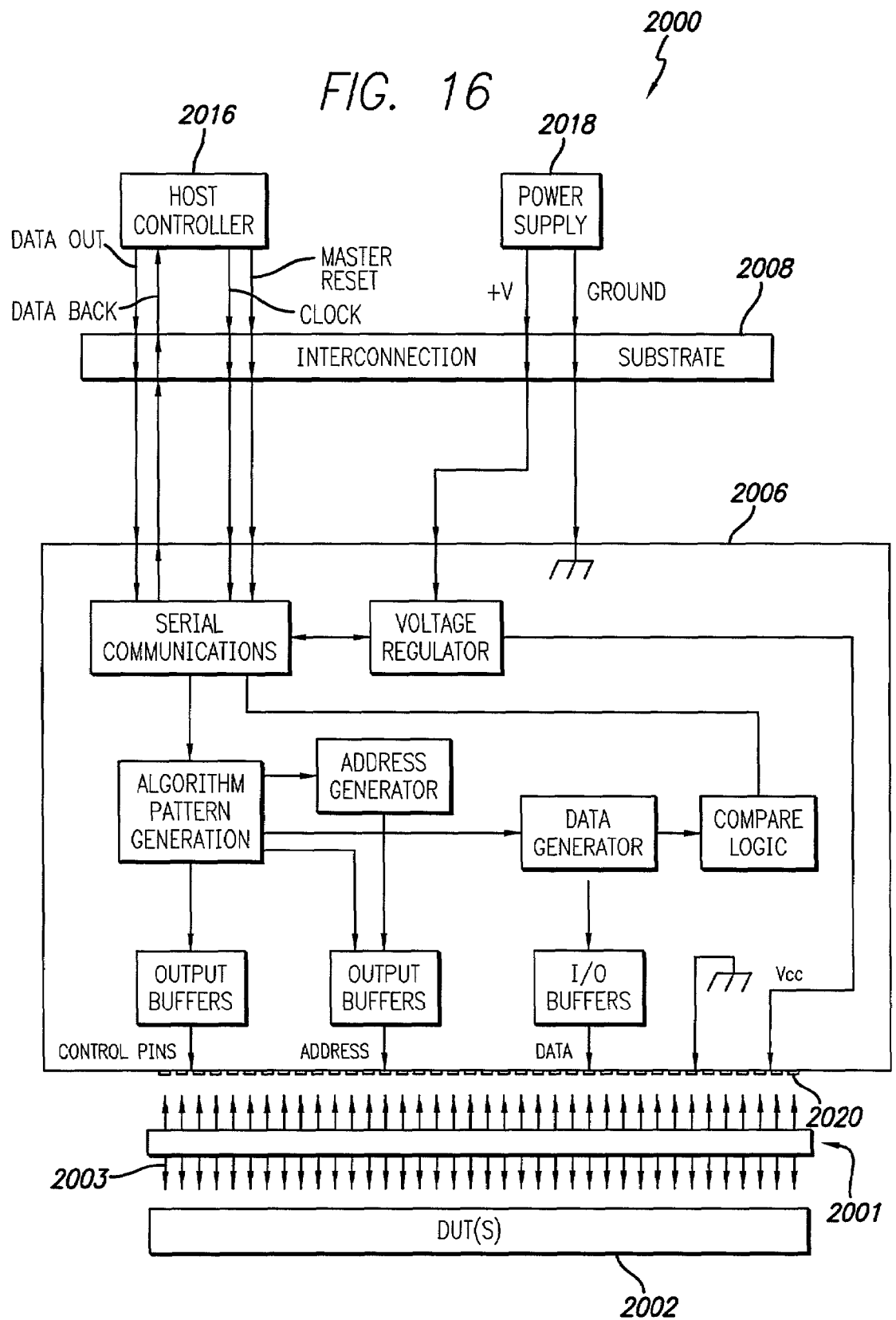
FIG. 16 shows an interposer interconnecting a plurality of DUTs to a plurality of ASICs in accordance with an embodiment of the present invention.

FIG. 16 illustrates an instantiation of the system 1900 of the present invention, illustrating a number of features, which would be applicable to a variety of instantiations of the technique of the present intention. These features are a plurality of ASICs 2006, mounted to an interconnection (support) substrate 2008, and a plurality of DUTs 2002 connected to the ASICs 2006, through an interposer 2001, having double-sided resilient contact elements as discussed hereinabove and indicated by the arrows 2003. A power supply 2018 provides power, via the interconnection substrate 2008, via ASICs 2006 and via interposer 2001, to the DUTs 2002 to power them up for operation. This is especially useful for testing and also useful for burn-in.

Host controller 2016 provides signals to the ASICs 2006 via the interconnection substrate 2008. Relatively few signals, for example a serial stream of data, need to be provided to each ASIC in order to individually control the plurality (one of many shown) of ASICs 2006 mounted to the interconnection substrate 2008. ASICs 2006 contact the resilient elements on the top surface of the interposer 2001 via the contact pads 2020. In one embodiment of the present invention, ASICs 2006 may be mounted adjacent to the contact pads 2020 thereby minimizing the signal path between ASICs 2006 and DUTs 2002. However, it may not be always possible to locate all the ASICs close to the contact pads 2020 so that in an alternative embodiment of the present invention, the ASIC, being farther from the contact pads 2020, are wired to the contact pads 2020.

The instantiation illustrated in FIG. 16 is an example of a system for testing DUTs, for example, memory devices. Host controller 2016 is connected to the plurality of ASICs 2008 through a data bus which needs very few (e.g., four) lines: a line for data out (labeled DATA OUT), a line for data back (labeled DATA BACK), a line for resetting the ASICs (labeled MASTER RESET), and a line conveying a clock signal (labeled CLOCK). All of the ASICs mounted to the interconnection substrate are connected to these FOUR "common" lines that are connected in the interconnection substrate to all of the ASICs. This illustrates the simplicity in realizing (i.e., manufacturing) an interconnection substrate (2008), which is adapted in use to test a plurality of complicated electronic components (DUTs).

Power (labeled+V) and ground (labeled GROUND) connections are similarly easily dealt with in the interconnection substrate. Essentially, only two lines are required in the interconnection substrate, which are preferably realized as planes (i.e., a power plane and a ground plane) in a multiplayer interconnection substrate. More details may be found in commonly assigned PCT Publication No. WO/97,43656, entitled "Wafer Level Burn-in and Test", the disclosure of which is herein incorporated by reference as though set forth in full.

Communication, power and testing may be handled by a suitable ASIC and control and support system, such as discussed in U.S. Pat. No. 5,497,079, issued to Yamada et al. and owned by Mitsubishi, Inc. and PCT Publication No. WO/97, 43656.

A problem associated with prior art techniques of powering up a plurality of DUTs is voltage drop through the interconnection substrate. This problem is overcome by the present invention by providing increased voltage to the ASICs (2006) and incorporating a voltage regulator (labeled VOLTAGE REGULATOR) in the ASICs.

One having ordinary skill in the art to which the present invention most nearly pertains will recognize that additional functionality, not specifically illustrated, may readily be incorporated into the ASICs. For example, providing each ASIC with a unique address and an address decoding function, to individualize its response to a serial stream of data coming form the controller 2016.

The operation and further details of a prior art system that shares some of the same structures as disclosed in FIG. 16 is discussed in PCT Publication No. WO 97/43656. In FIG. 16, each ASIC can readily communicate over a large number of interconnection elements (spring contact elements) with the DUT to which it is connected through the interposer 2001. Additionally, the ASICs resident on the interconnection substrate can communicate multiples of the large number of connections between the ASICs and the DUTs.

In the event of use of ASICs on the tester side of the substrate, a 1:1 correspondence is typically required between the tester pads and the DUT pads, unless a multiplexing circuitry is built into the DUT wafer. The system as described accomplishes this by using the ASCIs connected directly to the WUT via the interposer, and then a small number of connections from the ASICs to the tester board.

In the interposer of the present invention, if active components or other busing schemes are built into the interposer, the overall "connection count" can substantially be decreased, most notably in the interconnection substrate. For example, an 8-inch wafer may contain 500 16 Mb DRAMs, each having 60 bond pads, for a total of 30,000 connections. Using the technique of the present invention, these 30,000 connections are directly made between the ASICs and the DUTs; and, from the ASICs, through the interconnection (support substrate), back to the host controller, e.g., power (2 lines) and a serial signal path (as few as two lines, including the ground line from the power source). This is in marked contrast to techniques of any prior art which, even if it were to use the ASICs of the present invention or similar instrumentality, would require connecting the ASICs via an interconnection substrate to means interconnecting the interconnection substrate to the DUTs. The present invention completely eliminates this problem, and substantially reduces the numbers of nodes required on the interconnection substrate, by effecting connections directly between the ASICs and the DUTs.

Another aspect of the present invention is in the use of the various interposers presented and discussed herein as an in-circuit emulator (ICE) for use in testing the functionality of a product, such as an integrated circuit, that is yet unavailable. In such a case, as known to those skilled in the art, an ICE is use to create the same functions as those that would eventually be carried out by the product in development therefore expediting the testing process of the product.

Figure 17:
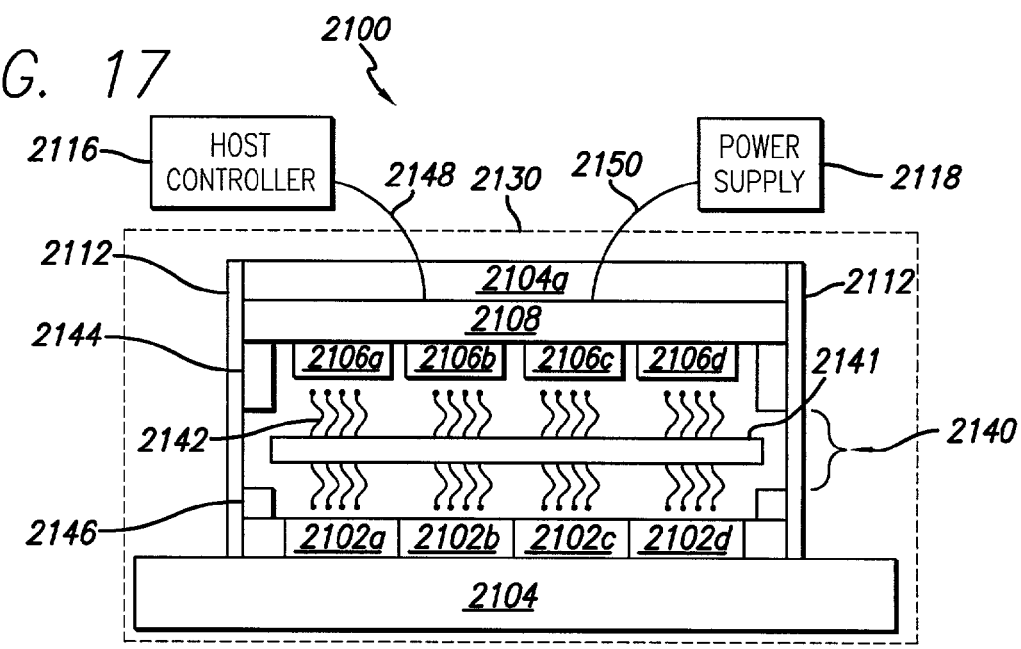
FIG. 17 shows an interconnect assembly including a host controller, a power supply and a vacuum vessel in accordance with an embodiment of the present invention.

FIG. 17 shows an interconnect assembly 2100 including a host controller 2116, a power supply 2118 and a contactor system 2130 in accordance with another embodiment of the present invention. The contactor system 2130 comprises base plates 2104 and 2104a, an interconnection substrate 2108, a plurality of ASICs 2106a-2106d, a plurality of DUTS 2102a-2102d and an interposer 2140. Interposer 2140 may be any of the embodiments disclosed hereinabove. Interposer 2140 comprises a substrate 2141 and resilient contact elements 2142.

The host controller 2116 is coupled to the interconnection substrate 2108 through the interface line 2148 and the power supply is coupled to the interconnection substrate 2108 through the transmission line 2150. Guide pins 2112 allow the upper base plate 2104a to be lowered so that the ASICs 2106a-2106d come in contact with the resilient contact elements 2142 on the upper side of the substrate 2140. Resilient contact elements 2142 on the lower side of the substrate 2140 rest against the DUTs 2102a-2102d. At this point electrical contact is established between the various ASICs and DUTs making it possible to test and probe various DUTs at the same time on the wafer-level.

Base plate 2104a is stopped from moving too far and over compressing the resilient contact elements 2142 by the compression stops 2144. Additionally, compression stops may be disposed between 2140 and/or 2106 and/or 2102 as discussed above in connection with FIG. 3b.

Power supply 2118 provides the power required for testing the DUTs and the host controller 2116 manages the various aspects of testing performed on the DUTs, as discussed herein below.

Figure 18A:
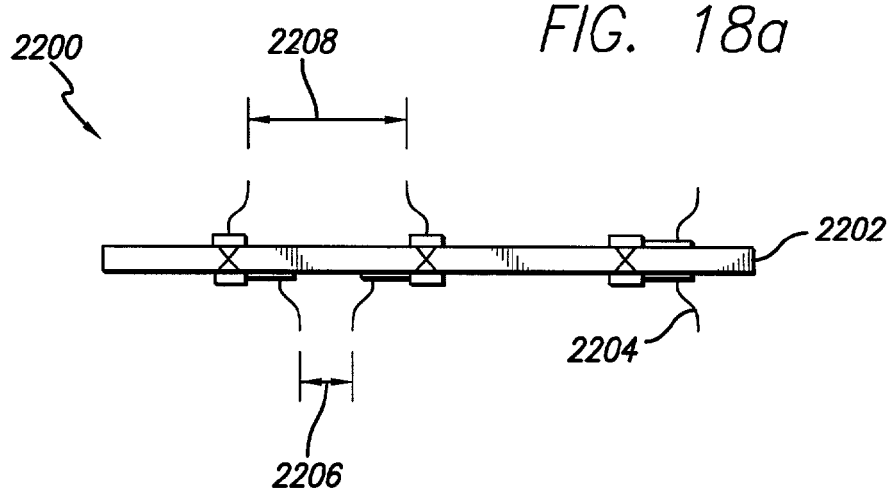
FIG. 18a shows an interposer comprising a substrate and various beam-type resilient contact elements in accordance with an embodiment of the present invention.

In FIG. 18a, an interposer 2200 is shown comprising a substrate 2202 and various beam-type resilient contact elements such as 2204. The main feature of interposer 2200 is that the resilient contact elements are not aligned so that different pitch lengths may be accommodated on the two surfaces of the interposer. Shown in FIG. 18a is a smaller pitch length 2206 on the bottom surface of the interposer and a longer pitch length 2208 on the top surface of the interposer.

In this way, interposer 2200 offers the flexibility of interconnecting different types of devices. For example, one surface may be connected to a device having a standard pitch pattern while the other surface may accommodate a device with a specific pitch.

Figure 18B:
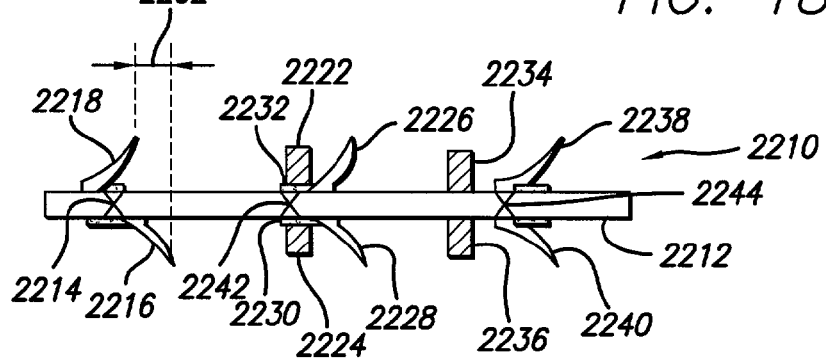
FIG. 18b shows an interposer assembly including contact elements and compression stops in various positions in accordance with an embodiment of the present invention.

In FIG. 18b, there is shown, an interposer assembly 2210 with various contact elements mounted on a substrate 2212. Substrate 2212 includes three through-holes. Each through-hole represents a possible variation on the way contact elements may be mounted on the substrate 2212. On the first through-hole 2214 is mounted two contact elements 2218 and 2216 whose tips are offset as indicated by the arrow 2220.

At the second through-hole 2242 contact elements 2226 and 2228 are mounted on the bases 2224 and 2232. The compression stops 2222 and 2224 are mounted directly on top of the bases 2232 and 2230, respectively. In an alternative embodiment, the contact elements 2238 and 2240 are mounted on the through-hole 2244. However, the compression stops 2234 and 2236 are mounted away from the contact elements 2238 and 2240, as shown in FIG. 18b. Hence, various ways of attaching contact elements to an interposer are possible which fall within the scope and spirit of the present invention.

In the foregoing specification, the present invention has been described with reference to specific exemplary embodiments thereof. It will, however, be evident that various modifications and changes may be made thereto without departing from the broader scope and spirit of the invention as set forth in the appended claims. The specification and drawings are, accordingly, to be regarded in an illustrative rather than in a restrictive sense.

What is claimed is:

1. A test apparatus for testing an electronic device, said test apparatus comprising:
   a contactor comprising a first plurality of terminals;
   an interposer comprising:
      a substrate,
      a first plurality of elongate, resilient contact elements extending from a first side of said substrate, and
      a second plurality of contact elements corresponding to a second side of said substrate, ones of said first plurality of contact elements being electrically connected to ones of said second plurality of contact elements; and
   means for positioning and attaching said interposer to said contactor such that in testing at least one of said contactor or said interposer is moveable between a first position and a second position while said interposer is positioned close or attached to said contactor, wherein in said first position when said interposer is supported by said contactor, said first plurality of contact elements do not contact said first terminals on said contactor, and in said second position when said interposer is not supported by said contactor, said first plurality of contact elements contact said first terminals on said contactor and said first plurality of contact elements and said second plurality of contact elements provide electrical connections from said first terminals on said contactor to a second plurality of terminals on said electronic device.

2. The test apparatus of claim 1, wherein each of said contact elements of at least one of said first plurality of contact elements and said second plurality of contact elements are lithographically formed.

3. The test apparatus of claim 1, wherein each of said contact elements of at least one of said first plurality of contact elements and said second plurality of contact elements comprise a cantilever beam.

4. The test apparatus of claim 1, wherein said substrate is flexible.

5. The test apparatus of claim 1, wherein said substrate comprises silicon.

6. The apparatus of claim 1, wherein said contactor further comprises an interface to a host controller.

7. The apparatus of claim 1, wherein said electronic device comprises a semiconductor device.

8. The apparatus of claim 1, wherein said first plurality of elongate, resilient contact elements is disposed on said first side of said substrate, and said second plurality of contact elements is disposed on said second side of said substrate.

9. The test apparatus of claim 8, wherein said first plurality of contact elements are disposed on said first side of said substrate at a first pitch, and said second plurality of contact elements are disposed on said second side of said substrate at a second pitch different than said first pitch.

10. The test apparatus of claim 1, wherein said first plurality of contact elements are compressed while said ones of said second plurality of terminals on said electronic device are pressed against said ones of said second plurality of contact elements.

11. The test apparatus of claim 10 further comprising a stop structure for limiting compression of said first plurality of contact elements.

12. The apparatus of claim 1 further comprising a base for supporting said electronic device.

13. The apparatus of claim 12, wherein said base is further configured to move said electronic device such that said ones of said second plurality of terminals on said electronic device are moved out of contact with said ones of said second plurality of contact elements.

14. The test apparatus of claim 1, wherein said contactor comprises an integrated circuit.

15. The test apparatus of claim 14, wherein said contactor comprises a plurality of integrated circuits.

16. The test apparatus of claim 14, wherein said first plurality of terminals are disposed on said integrated circuit.

17. The test apparatus of claim 14, wherein said integrated circuit comprises circuitry for testing said electronic device.

18. The test apparatus of claim 1 further comprising an electronic component disposed on said substrate.

19. The test apparatus of claim 18, wherein said electronic component is disposed between ones of said contact elements.

20. The test apparatus of claim 18 further comprising a plurality of said electronic components.

21. The test apparatus of claim 20, wherein at least one of said plurality of electronic components is disposed on said first side of said substrate between ones of said first plurality of contact elements, and at least another of said plurality of electronic components is disposed on said second side of said substrate between ones of said second plurality of contact elements.

22. The test apparatus of claim 1, wherein the contactor comprises an integrated circuit and ones of the first plurality of terminals are input pads or output pads of the integrated circuit.

23. The test apparatus of claim 22, wherein the integrated circuit comprises power regulator circuitry configure to regulate power provided to said electronic device.

24. The test apparatus of claim 22, wherein the integrated circuit comprises power regulator circuitry configured to output to one of the output pads regulated power.

25. A test apparatus for testing an electronic device, said test apparatus comprising:
   a contactor comprising a first plurality of terminals;

an interposer comprising:
- a substrate,
- a first plurality of elongate, resilient contact elements extending from a first side of said substrate, and
- a second plurality of contact elements corresponding to a second side of said substrate, ones of said first plurality of contact elements being electrically connected to ones of said second plurality of contact elements; and means for positioning and attaching said interposer to said contactor such that in testing at least one of said contactor or said interposer is moveable between a first position and a second position while said interposer is positioned close or attached to said contactor, wherein in said first position when said interposer is supported by said contactor, said first plurality of contact elements do not contact said first terminals on said contactor, and in said second position when said interposer is not supported by said contactor, said first plurality of contact elements contact said first terminals on said contactor and said first plurality of contact elements and said second plurality of contact elements provide electrical connections from said first terminals on said contactor to a second plurality of terminals on said electronic device, wherein said interposer is moved from said first position to said second position upon application of forces to ones of said second plurality of contact elements.

26. The test apparatus of claim 25, wherein said means for attaching further functions to allow, while said interposer is attached to said contactor, said interposer to move from said second position to said first position upon removal of said forces from said second plurality of contact elements.

27. A test apparatus for testing an electronic device, said test apparatus comprising:
- a contactor comprising a first plurality of terminals;
- an interposer comprising:
  - a substrate,
  - a first plurality of elongate, resilient contact elements extending from a first side of said substrate, and
  - a second plurality of contact elements corresponding to a second side of said substrate, ones of said first plurality of contact elements being electrically connected to ones of said second plurality of contact elements; and means for positioning and attaching said interposer to said contactor such that in testing at least one of said contactor or said interposer is moveable between a first position and a second position while said interposer is positioned close or attached to said contactor, wherein in said first position when said interposer is supported by said contactor, said first plurality of contact elements do not contact said first terminals on said contactor, and in said second position when said interposer is not supported by said contactor, said first plurality of contact elements contact said first terminals on said contactor and said first plurality of contact elements and said second plurality of contact elements provide electrical connections from said first terminals on said contactor to a second plurality of terminals on said electronic device, wherein said interposer is moved from said first position to said second position in response to ones of said second plurality of terminals on said electronic device being pressed against ones of said second plurality of contact elements.

28. The test apparatus of claim 1, wherein said substrate is a single block structure.

29. The test apparatus of claim 28, wherein said first contact elements are attached to and extend from said first side of said block structure, and said second contact elements are attached to and extend from said second side of said block structure.

* * * * *